United States Patent
Lee et al.

(10) Patent No.: US 12,261,254 B2
(45) Date of Patent: Mar. 25, 2025

(54) DISPLAY DEVICE HAVING A PIXEL CIRCUIT LAYER INCLUDING A LENS PATTERN

(71) Applicant: Samsung Display Co., Ltd., Yongin-si (KR)

(72) Inventors: Ji Hye Lee, Yongin-si (KR); Kyung Bae Kim, Yongin-si (KR); Yu Jin Lee, Yongin-si (KR); Chong Chul Chai, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 107 days.

(21) Appl. No.: 16/742,795

(22) Filed: Jan. 14, 2020

(65) Prior Publication Data

US 2020/0403129 A1 Dec. 24, 2020

(30) Foreign Application Priority Data

Jun. 19, 2019 (KR) .......................... 10-2019-0073075

(51) Int. Cl.
| | |
|---|---|
| *H01L 33/58* | (2010.01) |
| *H01L 25/075* | (2006.01) |
| *H01L 33/24* | (2010.01) |
| *H01L 33/38* | (2010.01) |
| *H01L 33/60* | (2010.01) |
| *H01L 33/62* | (2010.01) |

(52) U.S. Cl.
CPC .......... *H01L 33/58* (2013.01); *H01L 25/0753* (2013.01); *H01L 33/24* (2013.01); *H01L 33/382* (2013.01); *H01L 33/60* (2013.01); *H01L 33/62* (2013.01)

(58) Field of Classification Search
CPC ............. H01L 27/3258; H01L 25/0753; H01L 51/5271; H01L 33/38; H01L 51/5275; H01L 33/24; H01L 33/58; H01L 33/60; H01L 33/62; H01L 33/382
USPC ......... 257/40, 59, 79, 88, E27.119, E51.018; 438/23, 27, 29, 34
See application file for complete search history.

(56) References Cited

U.S. PATENT DOCUMENTS

| | | | |
|---|---|---|---|
| 9,029,838 B2 | 5/2015 | Lim et al. | |
| 9,329,433 B2 | 5/2016 | Negishi et al. | |
| 9,379,283 B2 | 6/2016 | Cha et al. | |
| 10,008,645 B2 | 6/2018 | Bonar et al. | |
| 10,008,697 B2 | 6/2018 | Jang et al. | |
| 10,244,589 B2 | 3/2019 | Chen | |
| 10,461,123 B2 | 10/2019 | Kim et al. | |
| 10,622,518 B1 * | 4/2020 | Zhang | ............. H01L 31/035236 |

(Continued)

FOREIGN PATENT DOCUMENTS

| | | |
|---|---|---|
| CN | 105009309 A | 10/2015 |
| CN | 105976725 A | 9/2016 |

(Continued)

*Primary Examiner* — David Chen
(74) *Attorney, Agent, or Firm* — Womble Bond Dickinson (US) LLP

(57) ABSTRACT

A display device includes: a base layer; a pixel circuit layer on the base layer; and a display element layer on the pixel circuit layer. The pixel circuit layer includes a lens pattern at a recess between the display element layer and the base layer, the display element layer includes a light emitting element, and at least a portion of the light emitting element overlaps with the lens pattern.

12 Claims, 12 Drawing Sheets

(56) References Cited

U.S. PATENT DOCUMENTS

| | | | |
|---|---|---|---|
| 10,651,427 B2 | 5/2020 | Youn et al. | |
| 10,741,629 B2 | 8/2020 | Kim et al. | |
| 11,386,691 B2 | 7/2022 | Gao et al. | |
| 2004/0183436 A1* | 9/2004 | Ito | H10K 59/122 |
| | | | 313/506 |
| 2005/0040424 A1* | 2/2005 | Erchak | H01L 33/20 |
| | | | 257/E33.068 |
| 2007/0215886 A1* | 9/2007 | Takeuchi | H01L 33/0093 |
| | | | 438/47 |
| 2008/0024402 A1* | 1/2008 | Nishikawa | H05B 33/22 |
| | | | 345/82 |
| 2010/0019272 A1* | 1/2010 | Chen | H01L 33/145 |
| | | | 257/E33.001 |
| 2014/0175399 A1* | 6/2014 | Choi | H01L 27/3258 |
| | | | 257/40 |
| 2014/0206116 A1* | 7/2014 | Hwang | H01L 33/24 |
| | | | 438/29 |
| 2014/0312319 A1* | 10/2014 | Kim | H01L 27/3258 |
| | | | 257/40 |
| 2017/0082896 A1* | 3/2017 | Jang | G02F 1/133606 |
| 2017/0287997 A1* | 10/2017 | Park | H10K 77/111 |
| 2017/0294424 A1* | 10/2017 | Jeong | H01L 33/62 |
| 2018/0188606 A1* | 7/2018 | Lee | G02F 1/1339 |
| 2019/0165313 A1 | 5/2019 | Kim et al. | |
| 2019/0165320 A1* | 5/2019 | Choi | H01L 27/3248 |
| 2019/0214376 A1* | 7/2019 | Kim | H01L 27/1259 |
| 2020/0043400 A1* | 2/2020 | Chen | H01L 33/08 |
| 2020/0043976 A1* | 2/2020 | Kim | H01L 25/0753 |
| 2020/0168661 A1 | 5/2020 | Xue | |
| 2020/0343190 A1* | 10/2020 | Wu | H10K 77/111 |

FOREIGN PATENT DOCUMENTS

| | | |
|---|---|---|
| CN | 106486525 A | 3/2017 |
| CN | 108681703 A | 10/2018 |
| CN | 109728037 A | 5/2019 |
| CN | 109728186 A | 5/2019 |
| EP | 3293767 A2 | 3/2018 |
| KR | 100849737 B1 * | 8/2008 |
| KR | 10-2012-0138805 A | 12/2012 |
| KR | 10-2013-0007421 A | 1/2013 |
| KR | 10-2014-0096980 A | 8/2014 |
| KR | 10-2017-0094930 A | 8/2017 |
| KR | 10-2018-0072909 A | 7/2018 |
| KR | 10-2018-0073793 A | 7/2018 |
| KR | 10-1968592 B1 | 4/2019 |
| KR | 10-2020-0009175 A | 1/2020 |

\* cited by examiner

DISPLAY DEVICE HAVING A PIXEL CIRCUIT LAYER INCLUDING A LENS PATTERN

CROSS-REFERENCE TO RELATED APPLICATION

This application claims priority to and the benefit of Korean Patent Application No. 10-2019-0073075 filed in the Korean Intellectual Property Office on Jun. 19, 2019, the entire contents of which are incorporated herein by reference.

BACKGROUND

1. Field

One or more example embodiments of the present invention relate to a display device.

2. Description of the Related Art

Recently, there have been developed technologies for manufacturing ultra-small light emitting elements using materials having an inorganic crystal structure with high reliability, and for manufacturing a light emitting device using the light emitting elements. For example, there have been developed technologies for manufacturing a plurality of ultra-small light emitting elements having a size as small as nanoscale or microscale, and for manufacturing various light emitting devices including pixels using the ultra-small light emitting elements.

The above information disclosed in this Background section is for enhancement of understanding of the background of the present invention, and therefore, it may contain information that does not constitute prior art.

SUMMARY

One or more exemplary embodiments of the present invention are directed to a display device, including a plurality of light emitting elements, capable of improving an optical efficiency through a lens pattern unit (e.g., a lens pattern) under the light emitting element in the display device. However, the present invention is not limited thereto, and other aspects and features of the present invention may be understood by a person having ordinary skill in the art from the example embodiments described herein.

According to one or more exemplary embodiments, a display device includes: a base layer; a pixel circuit layer on the base layer; and a display element layer on the pixel circuit layer. The pixel circuit layer includes a lens pattern at a recess between the display element layer and the base layer, the display element layer includes a light emitting element, and at least a portion of the light emitting element overlaps with the lens pattern.

In one or more exemplary embodiments, the display element layer may include a first electrode and a second electrode spaced from the first electrode, and the light emitting element may be between the first electrode and the second electrode.

In one or more exemplary embodiments, the light emitting element may include a first semiconductor layer, an active layer surrounding at least a portion of the first semiconductor layer, and a second semiconductor layer of a different type from that of the first semiconductor layer and surrounding at least a portion of the active layer.

In one or more exemplary embodiments, the light emitting element may include a first end portion and a second end portion, the first end portion including the active layer, and the second end portion not including the active layer.

In one or more exemplary embodiments, the display element layer may include a first contact electrode on the first electrode and electrically connected to the first end portion, and a second contact electrode on the second electrode and electrically connected to the second end portion.

In one or more exemplary embodiments, the pixel circuit layer may include a plurality of transistors and an organic layer covering the plurality of transistors, the organic layer including the lens pattern.

In one or more exemplary embodiments, the display element layer may further include an insulating layer covering the first electrode, the second electrode, and the organic layer, and a refractive index of the insulating layer may be greater than a refractive index of the organic layer.

In one or more exemplary embodiments, the lens pattern may include an uneven pattern, and the uneven pattern may be configured to reflect an incident light irregularly.

In one or more exemplary embodiments, the first electrode and the second electrode may not overlap with the lens pattern.

In one or more exemplary embodiments, a width of the lens pattern may be less than a length of the light emitting element.

In one or more exemplary embodiments, the lens pattern may correspond one-to-one with the light emitting element.

In one or more exemplary embodiments, a width of the lens pattern may be greater than or equal to twice a length of the light emitting element.

According to one or more exemplary embodiments, a display device includes: a base layer; a pixel circuit layer on the base layer; and a display element layer on the pixel circuit layer. The pixel circuit layer includes a lens pattern including a plurality of taper portions, the display element layer includes a light emitting element, and at least a portion of the light emitting element overlaps with the lens pattern.

In one or more exemplary embodiments, the display element layer may include a first electrode and a second electrode spaced from the first electrode, and the light emitting element may be between the first electrode and the second electrode.

In one or more exemplary embodiments, the light emitting element may include a first semiconductor layer, an active layer surrounding at least a portion of the first semiconductor layer, and a second semiconductor layer of a different type from that of the first semiconductor layer and surrounding at least a portion of the active layer.

In one or more exemplary embodiments, the light emitting element may include a first end portion and a second end portion, the first end portion including the active layer, and the second end portion not including the active layer.

In one or more exemplary embodiments, the plurality of taper portions may include a first taper portion and a second taper portion spaced from the first taper portion, and a taper angle of the first taper portion may be different from a taper angle of the second taper portion.

In one or more exemplary embodiments, the pixel circuit layer may include a plurality of transistors and a metal layer on the plurality of transistors, the metal layer including the lens pattern and electrically connected to at least one of the plurality of transistors.

In one or more exemplary embodiments, the metal layer may include at least one of silver (Ag), magnesium (Mg), aluminum (Al), platinum (Pt), palladium (Pd), gold (Au), nickel (Ni), neodymium (Nd), iridium (Ir), chromium (Cr), titanium (Ti), or an alloy thereof.

In one or more exemplary embodiments, a width of the lens pattern may be less than or equal to a length of the light emitting element.

Other aspects and features of exemplary embodiments are described in more detail in the detailed description with reference to the drawings.

The display device according to an exemplary embodiment of the present invention may include a plurality of light emitting elements and may improve an optical efficiency by forming a lens pattern under the light emitting element.

In an exemplary embodiment, the lens pattern formed under the light emitting element may be formed together (e.g., concurrently or simultaneously) with one or more other structures without using a separate mask, thereby reducing a processing cost and improving a yield of the display device.

However, the aspects and features of the present invention are not limited thereto, and other aspects and features may be described in or understood from the present specification.

DETAILED DESCRIPTION

Figure 1A:
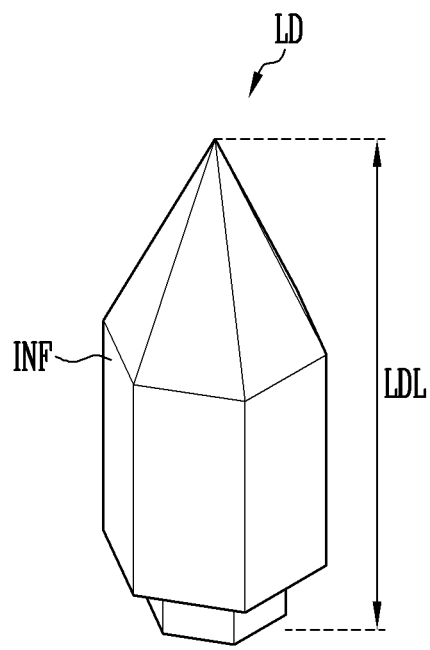
FIGS. 1A and 1B are a perspective view and a cross-sectional view, respectively, illustrating a light emitting element according to an exemplary embodiment.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1B:
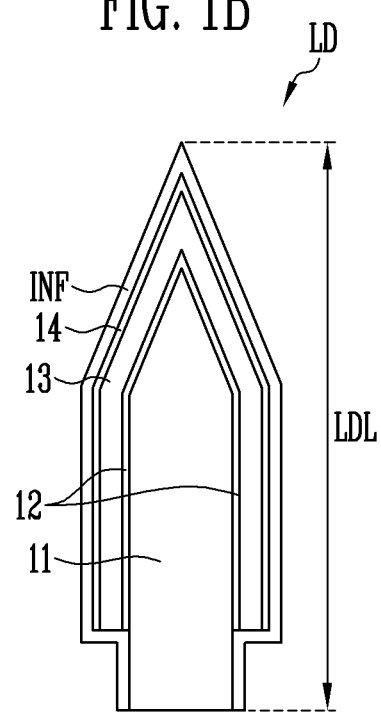
Figure 2A:
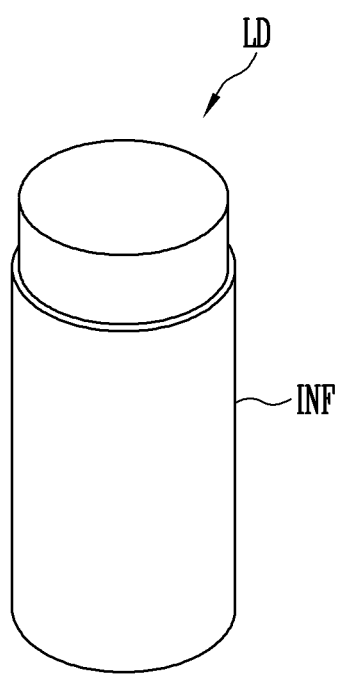
FIGS. 2A and 2B are a perspective view and a cross-sectional view, respectively, illustrating a light emitting element according to another exemplary embodiment.
Figure 2B:
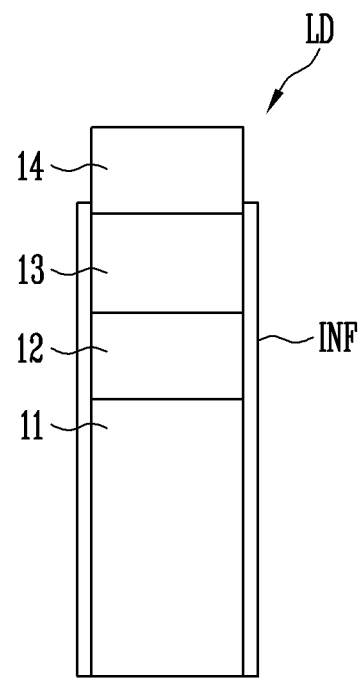

FIGS. 1A and 1B are a perspective view and a cross-sectional view, respectively, illustrating a light emitting element according to an exemplary embodiment. FIGS. 2A and 2B are a perspective view and a cross-sectional view, respectively, illustrating a light emitting element according to another exemplary embodiment. FIGS. 1A and 1B illustrate an example of a light emitting element LD having a core-shell structure, and FIGS. 2A and 2B illustrate an example of a light emitting element LD having a columnar rod-shaped structure, but a kind and/or shape of the light emitting element LD according to exemplary embodiments of the present invention is not limited thereto.

Referring to FIGS. 1A and 1B, a light emitting element LD according to an exemplary embodiment includes a first conductive semiconductor layer 11, a second conductive semiconductor layer 13, and an active layer 12 disposed between the first and second conductive semiconductor layers 11 and 13. According to an exemplary embodiment, the first conductive semiconductor layer 11 may be disposed at (e.g., in or on) a central area of the light emitting element LD, and the active layer 12 may be disposed on a surface of the first conductive semiconductor layer 11 so as to surround at least one area of the first conductive semiconductor layer 11. The second conductive semiconductor layer 13 may be disposed on a surface of the active layer 12 so as to surround at least one area of the active layer 12.

In some embodiments, the light emitting element LD may further include an electrode layer 14 and/or an insulating film INF surrounding at least one area of the second conductive semiconductor layer 13. For example, the light emitting element LD may include the electrode layer 14 disposed on the surface of the second conductive semiconductor layer 13 to surround an area of the second conductive semiconductor layer 13, and the insulating film INF may be disposed on a surface of the electrode layer 14 to surround at least one area of the electrode layer 14. In other words, the light emitting element LD according to an exemplary embodiment as described above may be implemented with a core-shell structure including the first conductive semiconductor layer 11, the active layer 12, the second conductive semiconductor layer 13, the electrode layer 14, and the insulating film INF, which are sequentially disposed from the center of the light emitting element LD to the exterior of the light emitting element LD. However, the present invention is not limited thereto, and in some embodiments, the electrode layer 14 and/or the insulating film INF may be omitted.

In an exemplary embodiment, the light emitting element LD may have a polygonal cone shape that extends in one direction (e.g., a first direction or an extending direction). For example, at least one area of the light emitting element LD may have a hexagonal cone shape. However, a shape of the light emitting element LD is not limited thereto, and may be variously changed.

When an extending direction (e.g., the first direction) of the light emitting element LD corresponds to a length direction LDL, the light emitting element LD may have one end (e.g., a first end) and another end (e.g., an opposite end, the other end, or a second end) in the length direction LDL. According to an exemplary embodiment, one of the first and second conductive semiconductor layers 11 and 13 may be disposed at one end of the light emitting element LD, and the other of the first and second conductive semiconductor layers 11 and 13 may be disposed at the other end of the light emitting element LD.

In an exemplary embodiment of the present invention, the light emitting element LD may be an ultra-small light emitting diode having a core-shell structure and a polygonal columnar shape, for example, a hexagonal cone shape having both ends protruded. For example, the light emitting element LD may have a size as small as nanoscale to microscale. For example, the light emitting element LD may have a width and/or a length LDL in the nanoscale range or the microscale range. However, the size and/or shape of the light emitting element LD may be variously changed according to design specifications (or conditions) of various devices that use the light emitting element LD as a light source, for example, such as a display device.

In an exemplary embodiment, opposite ends of the first conductive semiconductor layer 11 may have a protruded shape in the length direction LDL of the light emitting element LD. The protruded shapes of the opposite ends of the first conductive semiconductor layer 11 may be different from each other. For example, one end disposed at an upper side of the opposite ends of the first conductive semiconductor layer 11 may have a conical shape that tapers toward the upper side to one vertex. The other end disposed at a lower side of the opposite ends of the first conductive semiconductor layer 11 may have a polygonal columnar shape with a width (e.g., a predetermined width), but the present invention is not limited thereto. For example, in another exemplary embodiment of the present invention, the first conductive semiconductor layer 11 may have a polygonal shape that gradually narrows in width toward the lower side or have a stepped cross-section. However, the present invention is not limited thereto, and in other embodiments, the shapes of the opposite ends of the first conductive semiconductor layer 11 may be variously modified.

According to an exemplary embodiment, the first conductive semiconductor layer 11 may be disposed at a core (e.g., a center or central area) of the light emitting element LD. In some embodiments, the light emitting element LD may be provided in a shape corresponding to a shape of the first conductive semiconductor layer 11. For example, when the first conductive semiconductor layer 11 has a hexagonal conical shape, the light emitting element LD may have a hexagonal conical shape.

In some embodiments, the first conductive semiconductor layer 11 may include at least one n-type semiconductor layer. For example, the first conductive semiconductor layer 11 may include at least one semiconductor material such as, for example, InAlGaN, GaN, AlGaN, InGaN, AlN, and/or InN, and may include an n-type semiconductor layer doped with a first conductive dopant such as, for example, Si, Ge, Sn, and/or the like. However, the present invention is not limited to the materials provided above, and the first conductive semiconductor layer 11 may be formed of various suitable materials.

The active layer 12 may be provided and/or formed to surround an outer circumferential surface of the first conductive semiconductor layer 11 along the length direction LDL of the light emitting element LD. For example, the active layer 12 may be provided and/or formed to surround an area (e.g., remaining areas) of the first conductive semiconductor layer 11, except for the other end disposed at the lower end of the opposite ends of the first conductive semiconductor layer 11 in the length direction LDL of the light emitting element LD.

The active layer 12 may be formed as a single or multiple quantum well structure. In an exemplary embodiment, a cladding layer doped with a conductive dopant may be formed at an upper portion and/or lower portion of the active layer 12. For example, the cladding layer may include (or be formed of) an AlGaN layer and/or an InAlGaN layer. According to an exemplary embodiment, materials such as AlGaN, AlInGaN, and/or the like may be used to form the active layer 12, and/or the active layer 12 may include various suitable materials.

When a voltage that is greater than or equal to a threshold voltage is applied to opposite ends of the light emitting element LD, the light-emitting element LD emits light while electron-hole pairs are coupled in the active layer 12. Accordingly, an emission of the light emitting element LD may be controlled, such that the light emitting device LD may be used as a light source for various light emitting devices, for example, such as pixels of a display device.

The second conductive semiconductor layer 13 may be provided and/or formed to surround the active layer 12 of the light emitting element LD. The second conductive semiconductor layer 13 may include a semiconductor layer that is different (e.g., of a different type) from that of the first conductive semiconductor layer 11. For example, the second conductive semiconductor layer 13 may include at least one semiconductor material such as, for example, InAlGaN, GaN, AlGaN, InGaN, AlN, and/or InN, and may include a p-type semiconductor layer doped with a second conductive dopant such as, for example, Mg and/or the like. However, the present invention is not limited thereto, and in other embodiments, the second conductive semiconductor layer 13 may be formed of various suitable materials.

In an exemplary embodiment, the light emitting element LD includes an electrode layer 14 surrounding at least one side of the second conductive semiconductor layer 13. The electrode layer 14 may be an ohmic contact electrode that is electrically connected to the second conductive semiconductor layer 13, but the present invention is not limited thereto. In some embodiments, the electrode layer 14 may include a metal or a metal oxide. For example, the electrode layer 14 may include (or be formed of), for example, chromium (Cr), titanium (Ti), aluminum (Al), gold (Au), nickel (Ni), oxide or alloy thereof, a transparent electrode material such as indium tin oxide (ITO), indium zinc oxide (IZO), zinc oxide (ZnO), indium tin zinc oxide (ITZO), and/or the like, alone or in any suitable combination. In some embodiments, the electrode layer 14 may be transparent, substantially transparent, or translucent. Accordingly, light generated from the light emitting element LD may be transmitted through the electrode layer 14, and may be emitted to the outside of the light emitting element LD.

The light emitting element LD may further include an insulating film INF provided on a surface thereof. The insulating film INF may include a transparent insulating material. According to an exemplary embodiment, the insulating film INF may include at least one insulating material such as, for example, silicon dioxide (SiO2), silicon nitride (Si3N4), aluminum oxide (Al2O3), and/or titanium dioxide (TiO2), but the present invention is not limited thereto.

The insulating film INF may be provided to overlap with (or cover) a portion of an outer circumferential surface of the first conductive semiconductor layer 11 and an outer circumferential surface of the electrode layer 14. In an exemplary embodiment, the insulating film INF may be formed to cover an entire outer circumferential surface of the electrode layer 14, and then the insulating film INF may be partially removed to expose a portion of the electrode layer 14 for electrical connection with an electrode (e.g., a first electrode of a pixel).

The light emitting device including the light emitting element LD described above may be used in various kinds of devices that use a light source. For example, the light emitting device may be used in various kinds of electronic devices that use a light source, for example, such as a display device or a lighting device.

FIGS. 2A and 2B illustrate a light emitting element LD having a structure different from that of the light emitting element LD shown in FIGS. 1A and 1B. For example, the light emitting element LD of FIGS. 2A and 2B is shown having a columnar rod-shaped structure. That is, a type, a structure, a shape, and/or the like of the light emitting element LD according to an exemplary embodiment of the present invention may be variously modified. In an exemplary embodiment shown in FIGS. 2A and 2B, the same reference numerals are used for similar or the same constituent elements (e.g., corresponding constituent elements) as the exemplary embodiment shown in FIGS. 1A and 1B, and thus, repeat description thereof may be omitted.

Referring to FIGS. 2A and 2B, a light emitting element LD according to an exemplary embodiment of the present invention includes a first conductive semiconductor layer 11, a second conductive semiconductor layer 13, and an active layer 12 disposed between the first and second conductive semiconductor layers 11 and 13. For example, the light emitting element LD may be formed of a laminate in which a first conductive semiconductor layer 11, an active layer 12, a second conductive semiconductor layer 13, and an electrode layer 14 are sequentially stacked.

One of the first and second conductive semiconductor layers 11 and 13 may be disposed at one end of the light emitting element LD, and the other of the first and second conductive semiconductor layers 11 and 13 may be disposed at the other end of the light emitting element LD. In addition, the light emitting element LD may include an electrode layer 14 disposed on one end of the second conductive semiconductor layer 13.

In some embodiments, the light emitting element LD may further include an insulating film INF provided on a surface of the light emitting element LD. The insulating film INF may be formed on a surface of the light emitting element LD to surround the outer circumferential surface of the active layer 12, and may further surround a portion of each of the first and second conductive semiconductor layers 11 and 13. The insulating film INF may expose opposite ends of the light emitting element LD having different polarities.

The light emitting element LD may include a rod-shaped light emitting diode having a rod shape. As used in this specification, "rod-shaped" or "rod shape" refers to rod-like shapes or bar-like shapes that are longer in a length direction than a width direction (e.g., having an aspect ratio greater than 1), for example, such as a circular column shape or a polygonal column shape, and a shape of a cross-section thereof is not particularly limited. For example, a length of the light emitting element LD may be greater than a width (e.g., a diameter) in a cross-section thereof.

Figure 3:
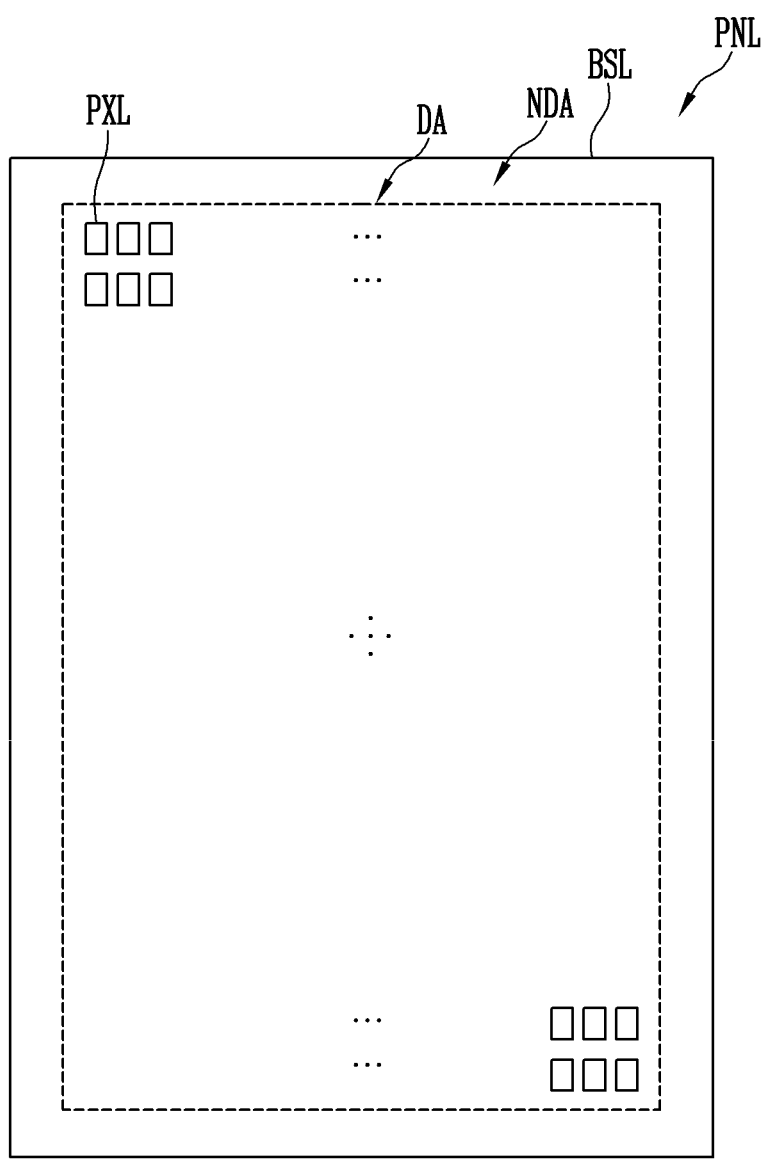
FIG. 3 is a top plan view illustrating a display device according to an exemplary embodiment.

FIG. 3 is a top plan view illustrating a display device according to an exemplary embodiment of the present invention. FIG. 3 illustrates a display device including a display panel PNL as an example of a device that may use the light emitting element LD (e.g., as described in the exemplary embodiments of FIGS. 1A to 2B) as a light source, according to an exemplary embodiment. For example, each pixel unit of the display panel PNL and each pixel PXL1, PXL2, and PXL3 included in the pixel unit may include a plurality of light emitting elements LD.

For convenience of illustration, a structure of the display panel PNL is schematically illustrated corresponding to a display area DA in FIG. 3. However, at least one driving circuit unit (e.g., at least one of a scan driver and a data driver) and/or a plurality of lines may be further disposed in the display panel PNL according to an exemplary embodiment.

Referring to FIG. 3, a display panel PNL according to an exemplary embodiment of the present invention may include a base layer BSL, and a plurality of pixels PXL disposed on the base layer BSL. According to an exemplary embodiment, the pixels PXL may include first color pixels PXL1, second color pixels PXL2 and/or third color pixels PXL3. Hereinafter, the terms "pixel PXL" or "pixels PXL" as used in this specification refer to at least one pixel from among the first color pixels PXL1, the second color pixels PXL2, and third color pixels PXL3, or collectively refer to two or more kinds of pixels.

In more detail, the display panel PNL and the base layer BSL for forming the display panel PNL may include a display area DA for displaying an image and a non-display area NDA that excludes the display area DA. The pixels PXL may be disposed in the display area DA on the base layer BSL.

The base layer BSL may form a base member of the display panel PNL. According to an exemplary embodiment, the base layer BSL may be a hard substrate or film or flexible substrate or film, and materials and properties thereof are not particularly limited. For example, the base layer BSL may be a hard substrate formed of glass or tempered glass, a flexible substrate (or thin film) formed of a plastic or a metallic material, or at least one insulating layer, and the materials and properties thereof are not particularly limited.

In some embodiments, the base layer BSL may be transparent, but the present invention is not limited thereto. For example, the base layer BSL may include a transparent, translucent, opaque, or reflective base member.

An area on the base layer BSL is defined as the display area DA in which the pixels PXL are disposed, and another area on the base layer BSL is defined as the non-display area NDA. For example, the base layer BSL may include the display area DA including a plurality of pixel areas where each pixel PXL is formed, and a non-display area NDA disposed adjacent to (e.g., around a periphery of) the display area DA. Various lines and/or internal circuit units connected to the pixels PXL of the display area DA may be disposed in the non-display area NDA.

A plurality of pixels PXL may be dispersed at (e.g., in or on) the display area DA. For example, the plurality of pixels PXL may be regularly arranged at (e.g., in or on) the display area DA according to a stripe or pentile array structure. However, the present invention is not limited thereto, and the pixels PXL may be arranged at (e.g., in or on) the display area DA in various suitable structures and/or arrangements.

According to an exemplary embodiment, two or more kinds of pixels PXL that emit different colors of light may be disposed in the display area DA. For example, a first color pixel PXL1 that emits a first color light, a second color pixel PXL2 that emits a second color light, and a third color pixel PXL3 that emits a third color light may be disposed in the display area DA. At least one of the first color pixel PXL1, the second color pixel PXL2, and the third color pixel PXL3, which may be disposed adjacent to each other, may form a pixel unit that emits light of various colors.

The color, type, and/or number of pixels PXL that constitute each pixel unit are not limited thereto. For example, the color of light emitted by each pixel PXL may be variously modified.

Each pixel PXL may include at least one light emitting element LD that is driven by control signals (e.g., scan signal and data signal) and/or power supplies (e.g., first power supply and second power supply). For example, each pixel PXL may include at least one ultra-small light emitting element LD having a size as small as nanoscale to microscale. For example, each pixel PXL may include a plurality of ultra-small light emitting elements that is connected in series and/or connected in parallel between first and second pixel electrodes and/or first and second power lines from a light source or light source unit of the corresponding pixel PXL.

In an exemplary embodiment, each pixel PXL may be formed of one or more active pixels. However, the type, structure, and/or driving method of the pixels PXL applicable to a display device of the present invention are not limited thereto. For example, each pixel PXL may be formed of one or more pixels of light emitting display devices with various suitable kinds of passive or active structures.

Figure 4A:
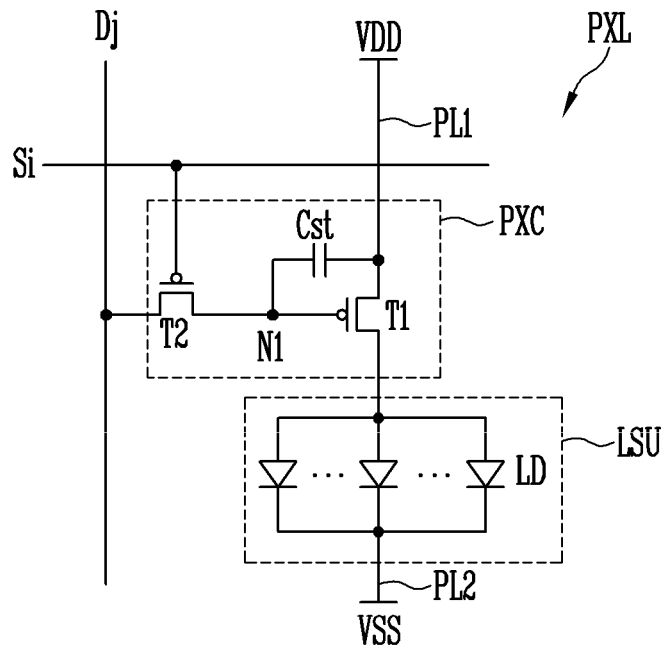
FIGS. 4A to 4C are circuit diagrams illustrating a pixel according to various exemplary embodiments.
Figure 4B:
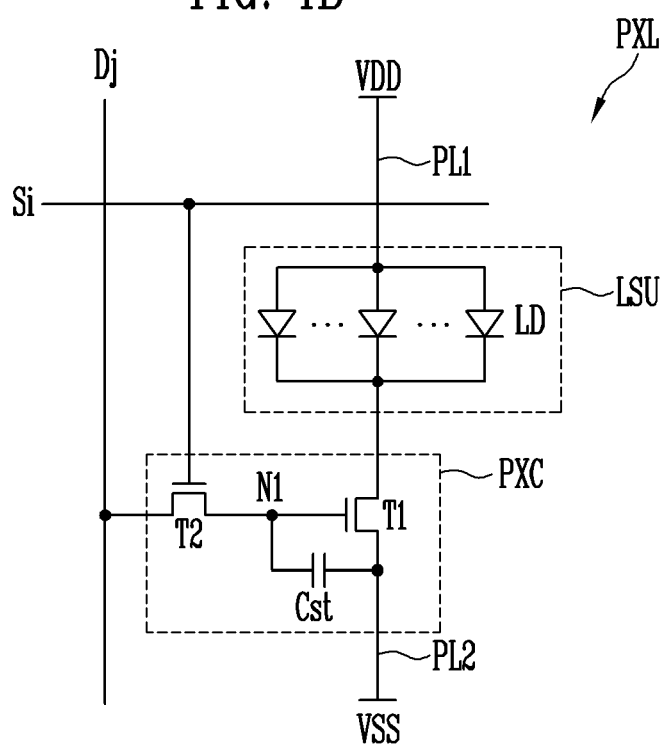
Figure 4C:
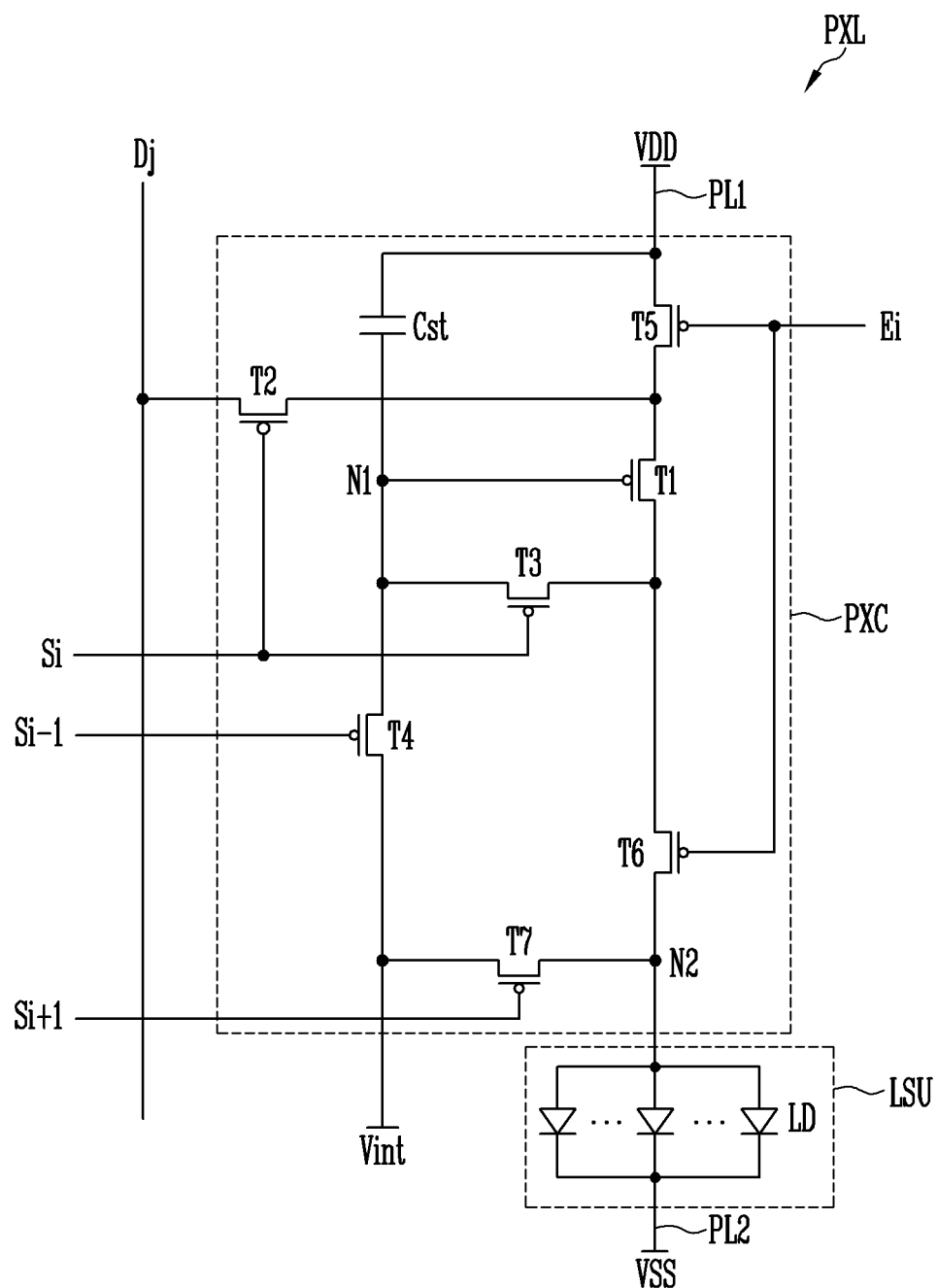

FIGS. 4A to 4C are circuit diagrams illustrating a pixel according to various exemplary embodiments. According to an exemplary embodiment, each pixel PXL shown in FIGS. 4A to 4C may be one of the first color pixel PXL1, the second color pixel PXL2, or the third color pixel PXL3 included in the display panel PNL (e.g., see FIG. 3). In some embodiments, the first color pixel PXL1, the second color pixel PXL2, and the third color pixel PXL3 may have the same or substantially the same (or similar) structure as each other.

Referring to FIG. 4A, the pixel PXL according to an exemplary embodiment of the present invention includes a light source unit (e.g., a light source) LSU for generating light having a luminance corresponding to a data signal. In some embodiments, the pixel PXL may include a pixel circuit PXC for driving the light source unit LSU.

According to an exemplary embodiment, the light source unit LSU may include a plurality of light emitting elements LD that are electrically connected between a first power supply VDD and a second power supply VSS. In an exemplary embodiment, the light emitting elements LD may be connected in parallel to each other, but the present invention is not limited thereto. For example, in another exemplary embodiment, a plurality of light emitting elements LD may be connected in series and/or connected in a parallel hybrid structure between the first power supply VDD and the second power supply VSS.

According to an exemplary embodiment, the first and second power supplies VDD and VSS may have different potentials so that the light emitting elements LD may emit light. For example, the first power supply VDD may include (e.g., be set to) a high potential power supply, and the second power supply VSS may include (e.g., be set to) a low potential power supply. In some embodiments, a difference in potential between the first and second power supplies VDD and VSS may be greater than or equal to the threshold voltage of the light emitting elements LD, for example, at least during an emission period of the pixel PXL.

While FIG. 4A shows that the light emitting elements LD of the light source unit LSU of each pixel PXL are connected in parallel in a same direction (e.g., in a forward direction) between the first power supply VDD and the second power supply VSS, the present invention is not limited thereto.

According to an exemplary embodiment, one end of a light emitting element LD included in each light source unit LSU may be commonly connected to the pixel circuit PXC through an electrode (e.g., one electrode) of the light source unit LSU (e.g., a first electrode and/or a first contact electrode of each pixel PXL), and may be connected to the first power supply VDD through the pixel circuit PXC and the first power line PL1. The other end of the light emitting element LD may be commonly connected to the second power supply VSS through the other electrode (e.g., a second electrode and/or a second contact electrode of each pixel PXL) of the light source unit LSU and a second power line PL2.

Each light source unit LSU may emit light having a luminance corresponding to a driving current supplied through the corresponding pixel circuit PXC. Accordingly, an image (e.g., a predetermined image) may be displayed at (e.g., in or on) the display area DA.

The pixel circuit PXC may be connected to the scan line Si and the data line Dj of the corresponding pixel PXL. For example, when the pixel PXL is disposed at an i-th (i is a natural number) row and a j-th (j is a natural number) column of the display area DA, the pixel circuit PXC of the pixel PXL may be connected to the i-th scan line Si and the j-th data line Dj of the display area DA. According to an exemplary embodiment, the pixel circuit PXC may include first and second transistors T1 and T2 and a storage capacitor Cst.

The first transistor (or driving transistor) T1 is connected between the first power supply VDD and the light source unit LSU. A gate electrode of the first transistor T1 is connected to a first node N1. The first transistor T1 controls a driving current supplied to the light source unit LSU in response to a voltage of the first node N1.

A second transistor (or switching transistor) T2 is connected between the data line Dj and the first node N1. A gate electrode of the second transistor T2 is connected to the scan line Si. The second transistor T2 is turned on when a scan signal having a gate-on voltage (e.g., a low level voltage) is supplied from the scan line Si to electrically connect the data line Dj to the first node N1.

During each frame period, the data signal of the corresponding frame is supplied to the data line Dj, and the data signal is transferred to the first node N1 via the second transistor T2. Accordingly, a voltage corresponding to the data signal is charged to the storage capacitor Cst.

One electrode of the storage capacitor Cst is connected to the first power supply VDD, and the other electrode of the storage capacitor Cst is connected to the first node N1. The storage capacitor Cst charges a voltage corresponding to the data signal supplied to the first node N1 during each frame period.

While the transistors included in the pixel circuit PXC, for example, the first and second transistors T1 and T2, are each shown as P-type transistors in FIG. 4A, the present invention is not limited thereto. For example, in another exemplary embodiment, at least one of the first and second transistors T1 and T2 may be modified to include an N-type transistor.

For example, as shown in FIG. 4B, each of the first and second transistors T1 and T2 may include N-type transistors. In this case, a gate-on voltage of the scan signal for writing the data signal supplied to the data line Dj during each frame period to the pixel PXL may be a high level voltage. Similarly, a voltage of the data signal for turning on the first transistor T1 may be a voltage having a waveform opposite to that used for the exemplary embodiment of FIG. 4A. For example, in the exemplary embodiment of FIG. 4B, the greater the grayscale value to be expressed, the higher voltage level of the supplied data signals.

The configuration and the operation of the pixel PXL shown in FIG. 4B are substantially similar to those of the pixel PXL shown in FIG. 4A, except that connection positions of some circuit elements and the voltage levels of control signals (e.g., scan signal and data signal) are modified corresponding to the modified type of the transistors (e.g., T1 and T2). Therefore, repeat description for the pixel PXL of FIG. 4B may be omitted.

The structures of the pixel circuit PXC are not limited to the exemplary embodiments shown in FIGS. 4A and 4B. In other embodiments, the pixel circuit PXC may be formed of pixel circuits of various suitable structures and/or driving methods. For example, the pixel circuit PXC may have the structure shown in the exemplary embodiment of FIG. 4C.

Referring to FIG. 4C, the pixel circuit PXC may be connected to at least one other scan line (or control line), in addition to being connected to the scan line Si of the corresponding horizontal line (or row). For example, the pixel circuit PXC of the pixel PXL disposed at the i-th row of the display area DA may be further connected to an i−1-th scan line Si−1 and/or an i+1-th scan line Si+1. In some embodiments, the pixel circuit PXC may be further connected to a third power supply in addition to the first and second power supplies VDD and VSS. For example, the pixel circuit PXC may also be connected to an initialization power supply Vint. According to an exemplary embodiment, the pixel circuit PXC may include first to seventh transistors T1 to T7 and a storage capacitor Cst.

The first transistor T1 is connected between the first power supply VDD and the light source unit LSU. For example, one electrode (e.g., a source electrode) of the first transistor T1 may be connected to the first power supply VDD through the fifth transistor T5 and the first power line PL1, and another electrode (e.g., a drain electrode) of the first transistor T1 may be connected to one electrode (e.g., a first electrode of the corresponding pixel PXL) of the light source unit LSU via the sixth transistor T6. A gate electrode of the first transistor T1 is connected to the first node N1. The first transistor T1 controls a driving current supplied to the light source unit LSU in response to a voltage of the first node N1.

The second transistor T2 is connected between the data line Dj and one electrode of the first transistor T1. A gate electrode of the second transistor T2 is connected to the corresponding scan line Si. The second transistor T2 is turned on when a scan signal having a gate-on voltage is supplied from the scan line Si to electrically connect the data line Dj to one electrode of the first transistor T1. Therefore, when the second transistor T2 is turned on, the data signal supplied from the data line Dj is transferred to the first transistor T1.

The third transistor T3 is connected between another electrode (e.g., a drain electrode) of the first transistor T1 and the first node N1. A gate electrode of the third transistor T3 is connected to the corresponding scan line Si. The third transistor T3 is turned on when a scan signal having a gate-on voltage is supplied from the scan line Si to connect (e.g., diode connect) the first transistor T1 in a diode form.

The fourth transistor T4 is connected between the first node N1 and the initialization power supply Vint. A gate electrode of the fourth transistor T4 is connected to the previous scan line, for example, the i−1-th scan line Si−1. The fourth transistor T4 is turned on when a scan signal having a gate-on voltage is supplied to the i−1-th scan line Si−1 to transfer a voltage of the initialization power supply Vint to the first node N1. According to an exemplary embodiment, a voltage of the initialization power supply Vint to initialize a gate voltage of the first transistor T1 may have a voltage level that is less than or equal to the lowest voltage level of the data signal.

The fifth transistor T5 is connected between the first power supply VDD and the first transistor T1. A gate electrode of the fifth transistor T5 is connected to a corresponding emission control line, for example, an i-th emission control line Ei. The fifth transistor T5 is turned off when an emission control signal having a gate-off voltage (e.g., a high level voltage) is supplied to the emission control line Ei, and is turned on in other cases.

The sixth transistor T6 is connected between the first transistor T1 and the light source unit LSU. A gate electrode of the sixth transistor T6 is connected to the corresponding emission control line, for example, the i-th emission control line Ei. The sixth transistor T6 is turned off when the emission control signal having a gate-off voltage is supplied to the emission control line Ei, and is turned on in other cases.

The seventh transistor T7 is connected between one electrode of the light source unit LSU (e.g., a first electrode of the corresponding pixel PXL) and the initialization power supply Vint. A gate electrode of the seventh transistor T7 is connected to one of the scan lines of a next stage, for example, an i+1-th scan line Si+1. The seventh transistor T7 is turned on when a scan signal having a gate-on voltage is supplied to the i+1-th scan line Si+1 to supply the voltage of the initialization power supply Vint to one electrode of the light source unit LSU. Accordingly, a voltage of one electrode of the light source unit LSU is initialized during each initialization period during which a voltage of the initialization power supply Vint is transferred to the light source unit LSU. However, the present invention is not limited thereto, and in other embodiments, a control signal for controlling an operation of the seventh transistor T7 may be variously modified. For example, in another exemplary embodiment, a gate electrode of seventh transistor T7 may be connected to the scan line of the corresponding horizontal line (e.g., the corresponding row), for example, the i-th scan line Si. In this case, the seventh transistor T7 is turned on when a scan signal having a gate-on voltage is supplied to the i-th scan line Si to supply a voltage of the initialization power supply Vint to one electrode of the light source unit LSU.

The storage capacitor Cst is connected between the first power supply VDD and the first node N1. The storage capacitor Cst stores a voltage corresponding to the data signal and the threshold voltage of the first transistor T1 supplied to the first node N1 during each frame period.

While FIG. 4C illustrates the transistors (e.g., T1 to T7) included in the pixel circuit PXC as P-type transistors, the present invention is not limited thereto. For example, in another embodiment, at least one of the first to seventh transistors T1 to T7 may be modified to include an N-type transistor.

However, the present invention is not limited to the structures of the pixel PXL shown in the exemplary embodiments of FIGS. 4A to 4C, and in other embodiments, each pixel PXL may have various suitable structures.

Figure 5:
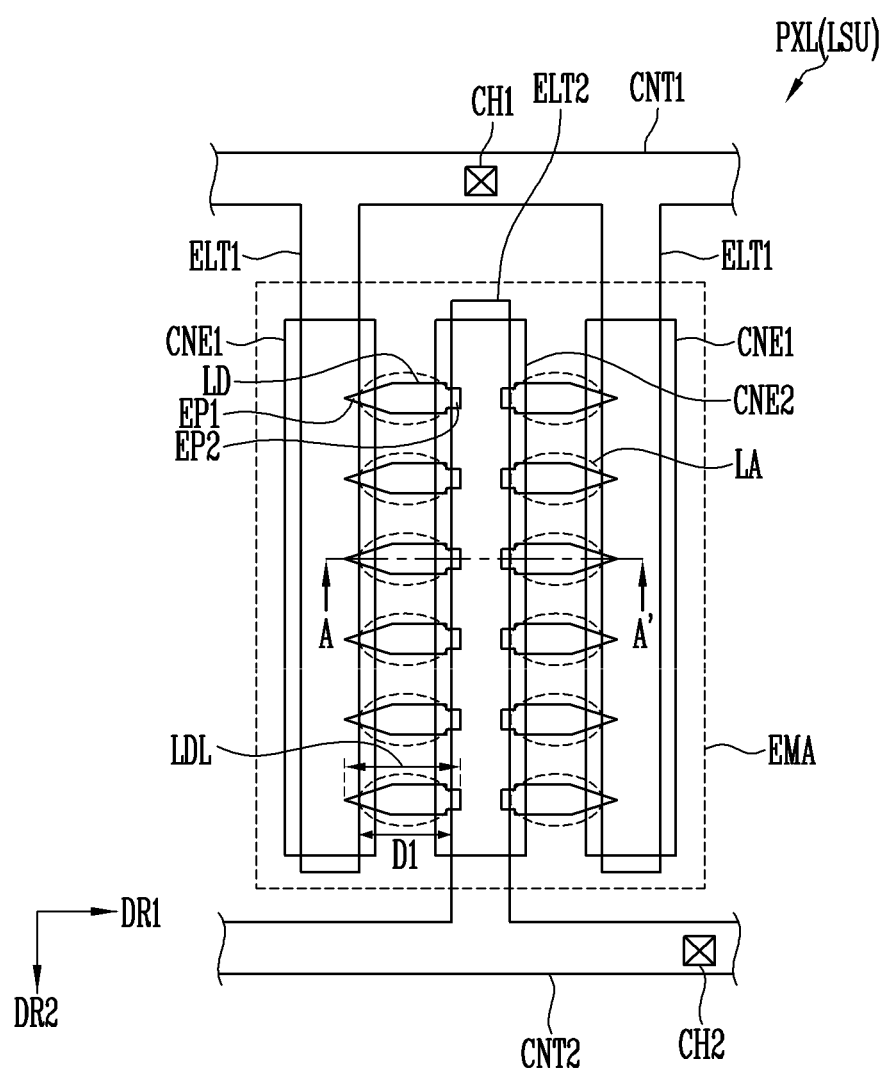
FIG. 5 is a top plan view illustrating a pixel according to an exemplary embodiment.

FIG. 5 is a top plan view illustrating a pixel according to an exemplary embodiment. According to an exemplary embodiment, each pixel PXL may have the same or substantially the same structure as that of any one of the pixels PXL shown in FIGS. 4A to 4C, but the present invention is not limited thereto.

For convenience of illustration, FIG. 5 shows the structure of each pixel PXL with respect to the light source unit LSU. However, the pixel PXL may further include a circuit element (e.g., at least one circuit element included in the pixel circuit PXC of FIGS. 4A to 4C) for controlling each light source unit LSU. According to an exemplary embodiment, the circuit element may be disposed on a different layer from that of the light source unit LSU. For example, the circuit element may be disposed on a pixel circuit layer disposed on one side of the base layer BSL, and the light source unit LSU may be disposed on a display element layer disposed on the pixel circuit layer.

In some embodiments, as shown in the exemplary embodiment of FIG. 5, each light source unit LSU is connected to a power line (e.g., first and/or second power lines PL1 and PL2), a circuit element (e.g., at least one circuit element included in the pixel circuit PXC), and/or a signal line (e.g., a scan line Si and/or a data line Dj) through first and second contact holes CH1 and CH2. In an exemplary embodiment of the present invention, at least one of first and second electrodes ELT1 and ELT2 of each pixel PXL may be directly connected to a power line (e.g., a predetermined power line) and/or a signal line without passing through a contact hole, an intermediate line, and/or the like.

Referring to FIG. 5, the pixel PXL according to an exemplary embodiment of the present invention may include a plurality of light emitting elements LD and electrodes included in each of the light source units LSU. For example, the pixel PXL may include a first electrode ELT1 and a second electrode ELT2 disposed to be spaced from each other in each pixel area. A plurality of light emitting elements LD may be disposed between the first and second electrodes ELT1 and ELT2. A first contact electrode CNE1 and a second contact electrode CNE2 may be disposed on the first electrode ELT1 and second electrode ELT2, respectively. The first and second contact electrodes CNE1 and CNE2 may be disposed to be spaced from each other in each pixel area, similar to the first and second electrodes ELT1 and ELT2, so that first end portions EP1 and second end portions EP2 of the light emitting elements LD may be connected to the first electrode ELT1 and second electrode ELT2, respectively.

The first electrode ELT1 and the second electrode ELT2 may be disposed to be spaced from each other in the pixel area where each pixel PXL is provided and/or formed, for example, an emission area EMA of the corresponding pixel PXL. According to an exemplary embodiment, each pixel area as used in this specification may refer to an area in which circuit elements and/or light source units LSU included in the corresponding pixel PXL are disposed. The emission area EMA may refer to an area in which the light emitting elements LD (for example, effective light sources that are fully connected between the first and second electrodes ELT1 and ELT2) included in the light source unit LSU of each pixel PXL are disposed. In some embodiments, the electrodes (e.g., first and second electrodes ELT1 and ELT2) that are connected to the light emitting elements LD, the first and second contact electrodes CNE1 and CNE2, and/or a portion thereof may be disposed in the emission area EMA. The emission area EMA may be surrounded by a light blocking and/or reflective bank structure (or pixel definition layer) formed between the pixels PXL to define each pixel area and the emission area EMA therein. For example, a bank structure surrounding the emission area EMA may be disposed around the emission area EMA.

The first and second electrodes ELT1 and ELT2 may be disposed to be spaced from each other. For example, the first and second electrodes ELT1 and ELT2 may be disposed in parallel to each other by a distance (e.g., a predetermined distance) in a first direction DR1 at (e.g., in or on) each emission area EMA.

In an exemplary embodiment, the first and second electrodes ELT1 and ELT2 may have a bar shape that extends in one direction. For example, each of the first and second electrodes ELT1 and ELT2 may have a bar shape that extends in a second direction DR2 crossing (e.g., orthogonally intersecting) the first direction DR1. However, the present invention is not limited thereto, and the shape, arrangement direction, and/or mutual disposition relation of the first and second electrodes ELT1 and ELT2 may be variously modified.

In some embodiments, at least one of each of the first and second electrodes ELT1 and ELT2 may be disposed in each pixel area, and the number of the first and second electrodes ELT1 and ELT2 disposed in each pixel area is not particularly limited. For example, a plurality of first electrodes ELT1 that extend in the second direction DR2 and are arranged parallel to each other may be disposed in each pixel area.

In some embodiments, at least one second electrode ELT2 that faces each first electrode ELT1 may be disposed in each pixel area. For example, in each pixel area, one second electrode ELT2 may be disposed between two first electrodes ELT1, or a plurality of second electrodes ELT2 corresponding to each of a plurality of first electrodes ELT1 may be disposed.

According to an exemplary embodiment, the first electrode ELT1 may be connected to a circuit element (e.g., at least one transistor included in a pixel circuit PXC), a power line (e.g., first power line PL1), and/or a signal line (e.g., a scan line Si, a data line Dj, or a control line) through a first connecting electrode CNT1 and/or a first contact hole CH1. In an exemplary embodiment, the first electrode ELT1 may be electrically connected to a circuit element (e.g., a predetermined circuit element) that is disposed under (e.g., underneath) the first electrode ELT1 through the first connecting electrode CNT1 and the first contact hole CH1, and may be electrically connected to a first line through the circuit element. The first line may include the first power line PL1 for supplying the first power supply VDD, but the present invention is not limited thereto. For example, in another exemplary embodiment, the first line may include a signal line to which a first driving signal (e.g., a scan signal, a data signal, or a control signal) is supplied.

In another exemplary embodiment, the first electrode ELT1 may be directly connected to a power line (e.g., a predetermined power line) or a signal line without passing through the first connecting electrode CNT1, the first contact hole CH1, and/or the circuit element. In this case, the first electrode ELT1 may be integrally or non-integrally connected to the power line (e.g., the predetermined power line) or the signal line.

According to an exemplary embodiment, the first electrode ELT1 and the first connecting electrode CNT1 may extend in different directions in each pixel area. For example, when the first connecting electrode CNT1 extends in the first direction DR1, the first electrode ELT1 may extend in the second direction DR2 crossing the first direction DR1.

In an exemplary embodiment, the first electrode ELT1 and the first connecting electrode CNT1 may be integrally connected to each other. For example, the first electrode ELT1 may be formed by branching at least one branch from the first connecting electrode CNT1. When the first electrode ELT1 and first connecting electrode CNT1 are integrally connected to each other, the first connecting electrode CNT1 may be regarded as a portion of the first electrode ELT1. However, the present invention is not limited thereto.

According to an exemplary embodiment, the second electrode ELT2 may be connected to a circuit element (e.g., at least one transistor included in a pixel circuit PXC), a power line (e.g., a second power line PL1), and/or a signal line (e.g., a scan line Si, a data line Dj, or a control line) through a second connecting electrode CNT2 and/or a second contact hole CH2. For example, the second electrode ELT2 may be electrically connected to the second power line PL2 disposed under (e.g., underneath) the second electrode ELT2 through the second connecting electrode CNT2 and the second contact hole CH2. In another exemplary embodiment, the second electrode ELT2 may be connected directly to a power line (e.g., a predetermined power line) or a signal line without passing through the second connecting electrode CNT2 and/or the second contact hole CH2. In this case, the second electrode ELT2 may be integrally or non-integrally connected to the power line or the signal line.

According to an exemplary embodiment, the second electrode ELT2 and the second connecting electrode CNT2 may extend in different directions. For example, when the second connecting electrode CNT2 extends in the first direction DR1, the second electrode ELT2 may extend in the second direction DR2 crossing the first direction DR1.

In an exemplary embodiment, the second electrode ELT2 and the second connecting electrode CNT2 may be integrally connected to each other. For example, the second electrode ELT2 may be formed by branching at least one branch from the second connecting electrode CNT2. When the second electrode ELT2 and the second connecting electrode CNT2 are integrally connected to each other, the second connecting electrode CNT2 may be regarded as a portion of the second electrode ELT2. However, the present invention is not limited thereto.

In an alignment step of the light emitting elements LD, an alignment signal (e.g., a predetermined alignment signal) is applied between the first and second electrodes ELT1 and ELT2, so that an electric field may be formed between the first and second electrodes ELT1 and ELT2. As a result of the electric field, the light emitting elements LD of each pixel area, for example, the emission area EMA of each pixel PXL, may be aligned between the first and second electrodes ELT1 and ELT2.

A plurality of light emitting elements LD may be arranged between the first and second electrodes ELT1 and ELT2. Each of the light emitting elements LD may be electrically connected between corresponding first and second electrodes ELT1 and ELT2.

Each of the light emitting elements LD may include a first end portion EP1 disposed at (e.g., on) one end in a length direction LDL and electrically connected to the first electrode ELT1, and a second end portion EP2 disposed at (e.g., on) another end (e.g., an opposite end) in the length direction LDL and electrically connected to the second electrode ELT2. For example, each of the light emitting elements LD may be arranged laterally along the first direction DR1 between the first and second electrodes ELT1 and ELT2, at (e.g., in or on) an area corresponding to where the first and second electrodes ELT1 and ELT2 are disposed to face each other.

While FIG. 5 illustrates that the light emitting elements LD are uniformly arranged along one direction, for example, the first direction DR1, the present invention is not limited thereto. For example, at least one of the light emitting elements LD may be arranged along an oblique direction between the first and second electrodes ELT1 and ELT2.

According to an exemplary embodiment, the light emitting elements LD may be prepared in a solution (e.g., a predetermined solution) in a dispersed form, and may be supplied to each pixel area (for example, the emission area EMA of each pixel PXL) using an inkjet method or the like. For example, the light emitting elements LD may be mixed with a volatile solvent and supplied to each emission area EMA. In this case, when an alignment voltage (e.g., a predetermined alignment voltage) or an alignment signal is applied to the first and second electrodes ELT1 and ELT2, an electric field is formed between the first and second electrodes ELT1 and ELT2, and the light emitting elements LD are aligned between the first and second electrodes ELT1 and ELT2. After the light emitting elements LD are aligned, a solvent may be volatilized or removed to stably dispose the light emitting elements LD between the first and second electrodes ELT1 and ELT2. In some embodiments, the first contact electrode CNE1 and the second contact electrode CNE2 may be formed at (e.g., on) opposite ends of the light emitting elements LD. For example, the first and second contact electrodes CNE1 and CNE2 may be formed at the first and second end portions EP1 and EP2 of the light emitting elements LD, respectively. As a result, the light emitting elements LD may be more stably connected between the first and second electrodes ELT1 and ELT2.

The first end portions EP1 of the light emitting elements LD may be electrically connected to the first power supply VDD via the first contact electrode CNE1, the first electrode ELT1, the pixel circuit PXC, and/or the first power line PL1. The second end portions EP2 of the light emitting elements LD may be electrically connected to the second power supply VSS via the second contact electrode CNE2, the second electrode ELT2, and/or the second power line PL2. Thus, at least one of the light emitting elements LD connected in a forward direction between the first and second electrodes ELT1 and ELT2 may emit light at a luminance corresponding to a driving current supplied from the pixel circuit PXC or the like. Accordingly, the pixel PXL emits light corresponding to the driving current.

The first and second end portions EP1 and EP2 of at least one of the light emitting elements LD arranged between the first and second electrodes ELT1 and ELT2 of each pixel PXL may be electrically connected to the first and second electrodes ELT1 and ELT2, respectively. For example, the first and second end portions EP1 and EP2 of the at least one of the light emitting elements LD may be electrically connected to the first and second electrodes ELT1 and ELT2 through the first and second contact electrodes CNE1 and CNE2, respectively.

The first contact electrode CNE1 may be disposed on the first electrode ELT1 to overlap with the first electrode ELT1. The first contact electrode CNE1 may be electrically connected to each first electrode ELT1 in at least one area. In addition, the second contact electrode CNE2 may be disposed on the second electrode ELT2 to overlap with the second electrode ELT2. The second contact electrode CNE2 may be electrically connected to the second electrode ELT2 in at least one area.

The pixels PXL may include a lens pattern unit (e.g., a lens pattern) LA having at least a portion that overlaps with each light emitting element LD. In some embodiments, the lens pattern unit LA may be formed to correspond one-to-one with each light emitting element LD, but the present invention is not limited thereto. For example, in other embodiments, a plurality of light emitting elements LD may correspond to one lens pattern unit (e.g., one lens pattern) LA.

The lens pattern unit LA may have a circular or elliptical shape in a plan view, but the present invention is not limited thereto. For example, in other embodiments, the lens pattern unit LA may have a triangle shape, a quadrangle shape, or another polygon shape. In an exemplary embodiment, the lens pattern unit LA may have an elliptical shape with a width in the first direction DR1 being greater than a width in the second direction DR2.

A width (or diameter) D1 of the lens pattern unit LA may be less than the length LDL of the light emitting element LD in an exemplary embodiment, but the present invention is not limited thereto, and the width D1 of the lens pattern unit LA may be greater than the length LDL of the light emitting element LD in another exemplary embodiment. For example, the width of the lens pattern unit LA may be greater than or equal to twice the length LDL of the light emitting element LD.

The lens pattern unit LA may be disposed under (e.g., underneath) the light emitting element LD to reflect light that is emitted downward from the light emitting element LD upward. Accordingly, in an exemplary embodiment, the lens pattern unit LA may improve an emission efficiency of a display device including the pixel PXL. According to an exemplary embodiment, the lens pattern unit LA may further include an uneven pattern. The uneven pattern of the lens pattern unit LA may reflect light that is irregularly incident on the lens pattern unit LA to an upper side. A viewing angle characteristic of the display device including the pixel PXL may be improved by the light reflected irregularly.

The lens pattern unit LA may be formed concurrently with the forming of one configuration (e.g., a second organic layer or a second metal layer) of the pixel circuit unit. That is, a separate mask process for forming the lens pattern unit LA may not be used. Because the lens pattern unit LA may be formed via a concurrent process, the process costs may be reduced and/or the process time may be shortened.

Figure 6:
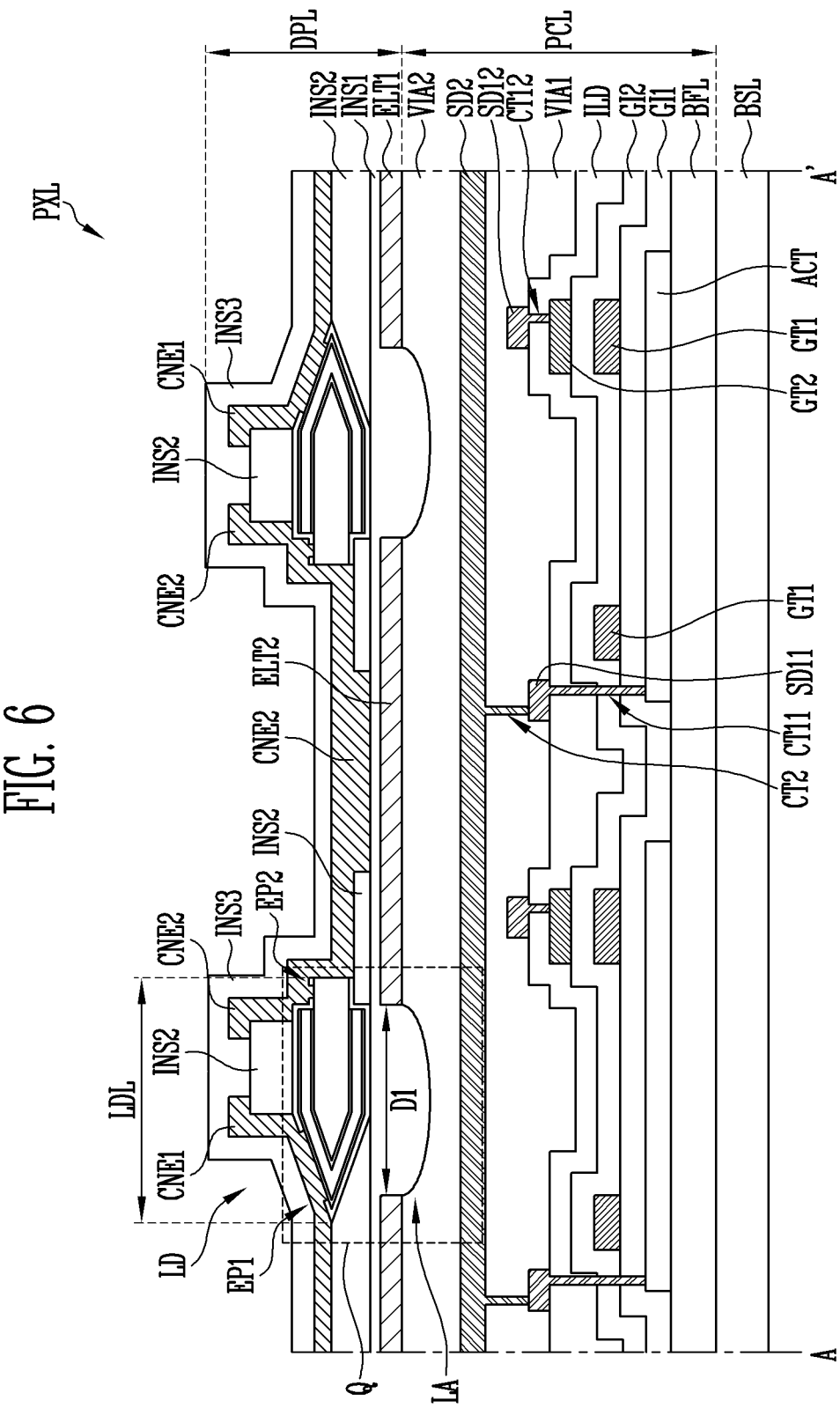
FIG. 6 is a cross-sectional view taken along the line A-A' of FIG. 5.

FIG. 6 is a cross-sectional view taken along the line A-A' of FIG. 5. In an exemplary embodiment of FIG. 6, the same reference numerals are given for similar or the same or substantially the same constituent elements (e.g., corresponding constituent elements) as one or more of the exemplary embodiments described above, and thus, redundant description thereof may be omitted.

Referring to FIGS. 5 and 6, a pixel PXL according to an exemplary embodiment of the present invention includes a display element layer DPL disposed on one surface of a base layer BSL and including a plurality of light emitting elements LD. In addition, the pixel PXL may further include a pixel circuit layer PCL. For example, the pixel PXL may further include a pixel circuit layer PCL disposed between the base layer BSL and the display element layer DPL, and including at least one circuit element electrically connected to the light emitting elements LD.

According to an exemplary embodiment, the pixel circuit layer PCL may include at least one circuit element included in the pixel circuit PXC. For example, the pixel circuit layer PCL may include a plurality of transistors and a storage capacitor included in the pixel circuit PXC, and may further include at least one power line and/or a signal line, and the like connected to the pixel circuit PXC and/or the light source unit LSU.

The pixel circuit layer PCL may include a plurality of insulating layers disposed between each electrode and/or lines. In an exemplary embodiment, the pixel circuit layer PCL may include a buffer layer BFL, a first gate insulating layer GI1, a second gate insulating layer GI2, an interlayer insulating layer ILD, a first organic layer VIA1, and a second organic layer VIA2 stacked (e.g., sequentially stacked) on one surface of the base layer BSL.

The buffer layer BFL may prevent or substantially prevent an impurity from diffusing into each circuit element. The buffer layer BFL may be formed of a single layer, but the present invention is not limited thereto, and the buffer layer BFL may be formed of multiple layers to include at least two or more layers. When the buffer layer BFL is provided in multiple layers, each layer may be formed of the same or substantially the same material or may be formed of different materials. However, the present invention is not limited thereto, and in another embodiment, the buffer layer BFL may be omitted.

Each transistor may include a semiconductor layer ACT, gate electrodes GT1 and GT2, and transistor electrodes (e.g., metal layers) SD11, SD12, and SD2.

The semiconductor layer ACT may be disposed on the buffer layer BFL. For example, the semiconductor layer ACT may be disposed between the base layer BSL (e.g., on which the buffer layer BFL is formed) and the first gate insulating layer GI1. The semiconductor layer ACT may include a source region, a drain region, and a channel region disposed between the source region and the drain region.

According to an exemplary embodiment, the semiconductor layer ACT may include a semiconductor pattern including or formed of polysilicon, amorphous silicon, oxide semiconductor, and/or the like. In addition, the channel region of the semiconductor layer ACT may include a semiconductor pattern that is not doped with impurities (e.g., an intrinsic semiconductor), and the source region and the drain region of the semiconductor layer ACT may each include a semiconductor pattern doped with impurities.

A first gate electrode GT1 may be disposed on the semiconductor layer ACT with the first gate insulating layer GI1 interposed therebetween. For example, the first gate electrode GT1 may be disposed between the first gate insulating layer GI1 and the second gate insulating layer GI2, and may overlap with at least one region of the semiconductor layer ACT. When the semiconductor layer ACT includes a plurality of channel regions, the first gate electrode GT1 disposed on the semiconductor layer ACT may be disposed in a plurality to include at least one region overlapping with each channel region.

A second gate electrode GT2 may be disposed on the first gate electrode GT1 with the second gate insulating layer GI2 interposed therebetween. For example, the second gate electrode GT2 may be disposed between the second gate insulating layer GI2 and the interlayer insulating layer ILD, and may overlap with at least one region of the first gate electrode GT1.

According to an exemplary embodiment, when a plurality of first gate electrodes GT1 are disposed, the second gate electrode GT2 may be disposed to overlap with one of the first gate electrodes GT1, and the second gate insulating layer GI2 may be disposed to overlap with all of the first gate electrodes GT1.

First metal layers SD11 and SD12 may be disposed on the semiconductor layer ACT, and on the gate electrodes GT1 and GT2 with at least one interlayer insulating layer ILD therebetween. For example, the first metal layers SD11 and SD12 may be disposed between the interlayer insulating layer ILD and the first organic layer VIA1.

The first metal layers SD11 and SD12 may be electrically connected to the semiconductor layer ACT or the gate electrodes GT1 and GT2. For example, one first metal layer SD11 from among the first metal layers SD11 and SD12 may be connected to the semiconductor layer ACT by a contact hole CT11 that passes through the first gate insulating layer GI1, the second gate insulating layer GI2, and the interlayer insulating layer ILD. The other first metal layer SD12 from among the first metal layers SD11 and SD12 may also be connected to the second gate electrode GT2 by a contact hole CT12 that passes through the interlayer insulating layer ILD.

The first organic layer VIA1 may be disposed on the first metal layers SD11 and SD12. The first organic layer VIA1 may include (or be formed of) an inorganic layer, for example, such as a silicon nitride layer, a silicon oxynitride layer, a silicon oxide layer, a titanium oxide layer, and/or an aluminum oxide layer. However, the present invention is not limited thereto, and the first organic layer VIA1 may include (or be formed of) an organic layer, for example, such as an acryl resin, an epoxy resin, a phenolic resin, a polyamide resin, a polyimide resin, and/or the like.

A second metal layer SD2 may be disposed on the semiconductor layer ACT, the gate electrodes GT1 and GT2, and the first metal layers SD11 and SD12 with the first organic layer VIA1 interposed therebetween. For example, the second metal layer SD2 may be disposed between the first organic layer VIA1 and the second organic layer VIA2. The second metal layer SD2 may be electrically connected to the semiconductor layer ACT, the gate electrodes GT1 and GT2, and/or the first metal layers SD11 and SD12. For example, the second metal layer SD2 may be connected to the first metal layer SD11 by a contact hole CT2 that passes through the first organic layer VIA1. The second metal layer SD2 may be disposed (e.g., entirely disposed) on the first organic layer VIA1, and then may be patterned to be electrically connected to the other layers.

The first metal layers SD11 and SD12 and the second metal layer SD2 may include at least one metal, for example, such as silver (Ag), magnesium (Mg), aluminum (Al), platinum (Pt), palladium (Pd), gold (Au), nickel (Ni), neodymium (Nd), iridium (Ir), chromium (Cr), titanium (T1), and/or alloys thereof, but the present invention is not limited thereto.

The second organic layer VIA2 may be disposed on the second metal layer SD2. The second organic layer VIA2 may include (or be formed of) an inorganic layer, for example, such as a silicon nitride layer, a silicon oxynitride layer, a silicon oxide layer, a titanium oxide layer, and/or an aluminum oxide layer. However, the second organic layer VIA2 is not limited thereto, and the second organic layer VIA2 may include (or be formed of) an organic layer, for example, such as an acryl resin, an epoxy resin, a phenolic resin, a polyamide resin, a polyimide resin, and/or the like.

The second organic layer VIA2 disposed on the second metal layer SD2 may include a lens pattern unit (e.g., a lens pattern) LA. The lens pattern unit LA may be formed to include at least a portion overlapping with the light emitting element LD. A width D1 of the lens pattern unit LA may be the same as or substantially the same as (e.g., equal to) the distance between the first and second electrodes ELT1 and ELT2, but the present invention is not limited thereto. For example, in other embodiments, the width D1 may be greater than or less than the distance between the first and second electrodes ELT1 and ELT2.

As described above, the lens pattern unit LA may be disposed under (e.g., underneath) the light emitting element LD to reflect light that is emitted downward from the light emitting element LD (e.g., toward the base layer with respect to the light emitting element) upward. Therefore, in some embodiments, the lens pattern unit LA may improve the emission efficiency of the display device.

In an exemplary embodiment, the lens pattern unit LA may be formed concurrently (e.g., simultaneously) with the forming of the second organic layer VIA2. For example, the lens pattern unit LA may be formed concurrently (e.g., simultaneously) when forming the second organic layer VIA2 by using a half-tone mask or a slit (e.g., a slit pattern) with a spacing (e.g., a predetermined spacing). In another exemplary embodiment, the lens pattern unit LA may be formed through a separate process after forming the second organic layer VIA2. For example, the lens pattern unit LA may be formed by an etching process after forming the second organic layer VIA2.

The lens pattern unit LA may be a recess pattern that is recessed toward the base layer with respect to an upper surface of the second organic layer VIA2. That is, a thickness of the second organic layer VIA2 may be thinner (e.g., the thinnest) at a center (or central portion) of the lens pattern unit LA, and may be thicker toward an edge of the lens pattern unit LA.

The light emitting element LD and the lens pattern unit LA of the second organic layer VIA2 will be described in more detail with reference to FIGS. 7A and 7B.

Figure 7A:
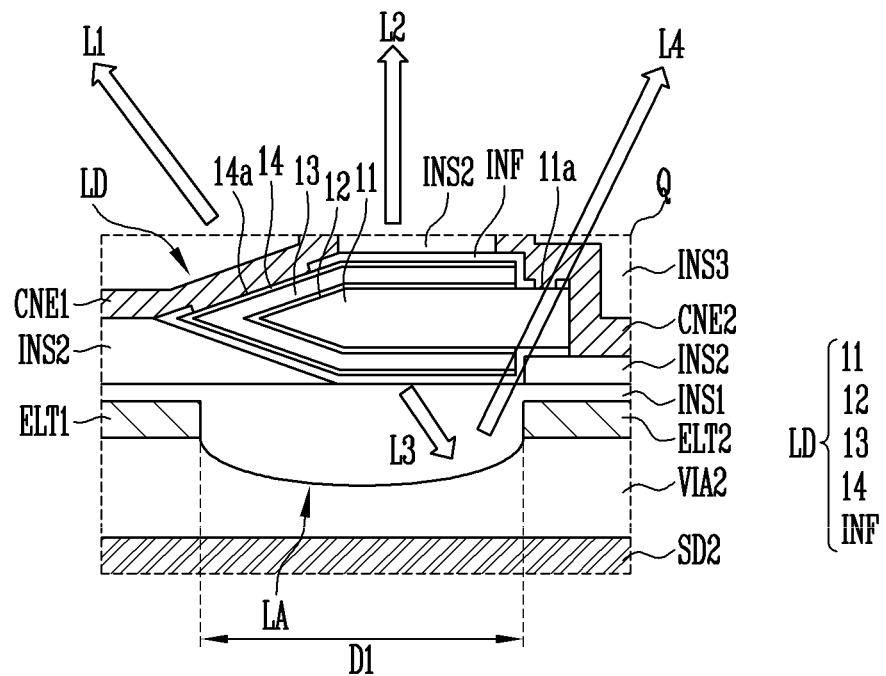
FIG. 7A is a partial enlarged view of the area Q of FIG. 6 according to an exemplary embodiment.

FIG. 7A is a partial enlarged view of the area Q of FIG. 6, according to an exemplary embodiment. FIG. 7B is a partial enlarged view of the area Q of FIG. 6, according to another exemplary embodiment.

Figure 7B:
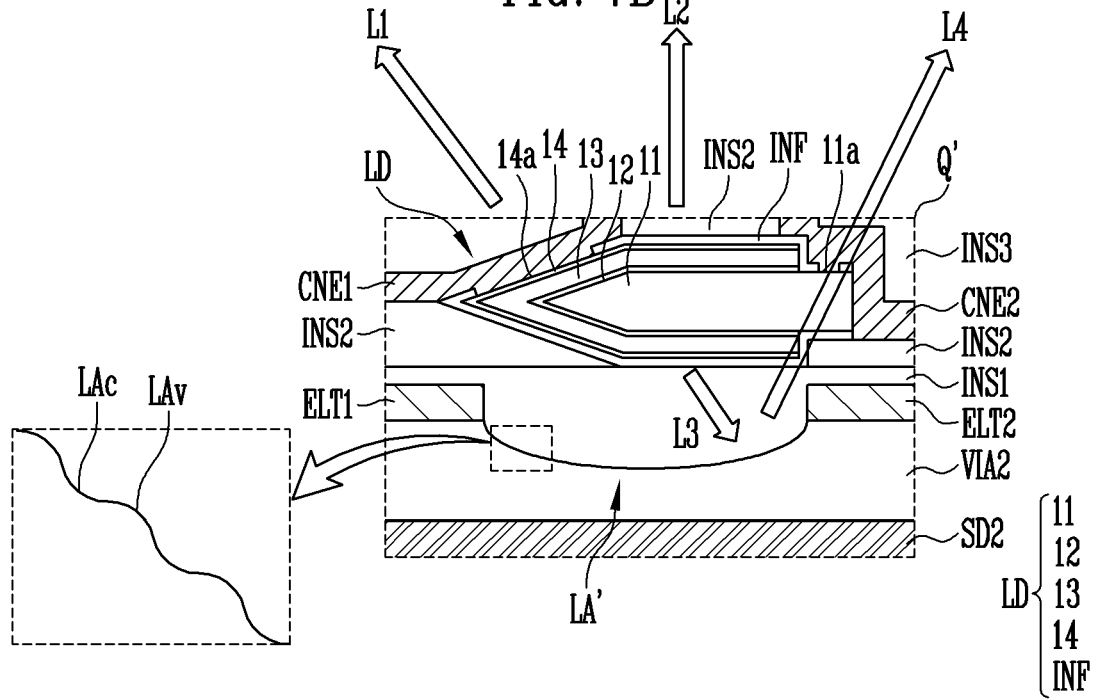
FIG. 7B is a partial enlarged view of the area Q of FIG. 6 according to another exemplary embodiment.

Referring to FIGS. 6, 7A, and 7B, the second organic layer VIA2 may include a lens pattern unit (e.g., a lens pattern) LA, and a light emitting element LD may be disposed on the lens pattern unit LA.

As described above, the light emitting element LD may include a first conductive semiconductor layer 11, an active layer 12, a second conductive semiconductor layer 13, an electrode layer 14, and an insulating film INF on (e.g., covering) the layers.

The first conductive semiconductor layer 11 and the second conductive semiconductor layer 13 may include (or be formed of) different kinds of semiconductor layers. For example, the first conductive semiconductor layer 11 may include an N-type semiconductor material, and the second conductive semiconductor layer 13 may include a P-type semiconductor material. The active layer 12 may be interposed between the first conductive semiconductor layer 11 and the second conductive semiconductor layer 13. The electrode layer 14 may be disposed to surround the second conductive semiconductor layer 13. The insulating film INF may be disposed to cover the electrode layer 14, and may be disposed to cover an outer surface (e.g., a protruded outer surface) of the first conductive semiconductor layer 11.

The light emitting element LD may include first and second openings 14a and 11a to be electrically connected in contact with the first and second contact electrodes CNE1 and CNE2, respectively.

The first opening 14a may be formed at (e.g., in or on) the insulating film INF, and at least a portion of the electrode layer 14 may be exposed through the first opening 14a. The electrode layer 14 may contact the first contact electrode CNE1 through the first opening 14a.

The second opening 11a may be formed at (e.g., in or on) the insulating film INF, and at least a portion of the first conductive semiconductor layer 11 may be exposed through the second opening 11a. The first conductive semiconductor layer 11 may contact the second contact electrode CNE2 through the second opening 11a.

The first opening 14a and the second opening 11a may be formed through an etching process after disposing the light emitting element LD on a first insulating layer INS1.

When a voltage is applied to the light emitting element LD through the first contact electrode CNE1 and the second contact electrode CNE2, the electron-hole pairs are coupled in the active layer 12, and the light emitting element LD emits light. Light L1, L2, and L3 emitted from the light emitting element LD may be emitted toward an outer direction with respect to the active layer 12 that is interposed between the first conductive semiconductor layer 11 and the second conductive semiconductor layer 13. However, one end of the first conductive semiconductor layer 11 that does not overlap with the active layer 12 and the second conductive semiconductor layer 13 may be an area where light is not emitted. The area where light is not emitted may be noticeable to a user as a difference of the viewing angle of the display device.

The light L1, L2, and L3 emitted from the light emitting element LD may include light (or light portions) L1 and L2 emitted upward with respect to the light emitting element LD, and light (or light portion) L3 emitted downward with respect to the light emitting element LD. The light portions L1 and L2 emitted upward may be emitted to the outside to be recognized (or viewed) by the user, but the light portion L3 emitted downward may not be emitted to the outside so that it may not be recognized (or viewed) by the user.

The second organic layer VIA2 and the first insulating layer INS1 that are disposed under the light emitting element LD may have different refractive indices from each other. For example, the refractive index of the second organic layer VIA2 may be lower than (or less than) the refractive index of the first insulating layer INS1. Because the first insulating layer INS1 and the second organic layer VIA2 may have different refractive indices from each other, a contact surface between the first insulating layer INS1 and the second organic layer VIA2 may form an optical interface.

At least a portion of the light L3 that is transmitted from the first insulating layer INS1 towards the second organic layer VIA2 may be reflected at the optical interface between the first insulating layer INS1 and the second organic layer VIA2. A reflected light L4 may be emitted (e.g., reflected) upward and may be viewed by the user. Accordingly, when the lens pattern unit LA is formed at (e.g., on) the second organic layer VIA2, the emitting efficiency of the display device may be improved.

In some embodiments, the lens pattern unit LA may control a reflection direction of the reflected light. The reflection direction of the reflected light may be changed according to (e.g., depending on) the shape of the lens pattern unit LA. For example, when the lens pattern unit LA is formed such that the reflected light L4 is directed toward one end (e.g., the area where light is not emitted) of the first conductive semiconductor layer 11, the area where light is not emitted of the light emitting element LD may be covered (e.g., may transmit the reflected light L4), thereby improving the viewing angle characteristic of the display device.

In an exemplary embodiment, a surface of the lens pattern unit LA may be formed to be generally a smooth surface to improve cohesion of the reflected light L4 and to improve light extraction efficiency. However, the surface of the lens pattern unit LA is not limited thereto. For example, in another exemplary embodiment, as shown in FIG. 7B, the surface of the lens pattern unit LA' may include an uneven pattern LAc and LAv. FIG. 7B is a modified exemplary embodiment of the exemplary embodiment shown in FIG. 7A.

The uneven pattern LAc and LAv may be formed along the surface of the lens pattern unit LA'. The uneven pattern LAc and LAv may reflect light in various directions (e.g., a random direction) by reflecting incident light irregularly. In other words, the uneven pattern LAc and LAv may improve the viewing angle characteristics of the display device by dispersing light quantities (e.g., light portions) in various directions (e.g., all directions), and by reducing the difference in the light quantities according to a viewing angle.

In more detail, in an exemplary embodiment, the uneven pattern LAc and LAv may include a plurality of concave patterns LAc and a plurality of convex patterns LAv. The concave pattern LAc and the convex pattern LAv may be alternately disposed. In an exemplary embodiment, widths of the concave pattern LAc and the convex pattern LAv may be the same or substantially the same as each other, but the present invention is not limited thereto, and the widths of the concave pattern LAc and the convex pattern LAv may be different from each other in other embodiments. In an exemplary embodiment, the widths of each of the concave patterns LAc may be the same or substantially the same as each other, but the present invention is not limited thereto, and the widths of each of the concave patterns LAc may be different from each other as needed or desired in other embodiments.

The uneven pattern LAc and LAv may be formed entirely at (e.g., in or on) the lens pattern unit LA', and may be formed at (e.g., in or on) a specific region and/or may not be formed at (e.g., in or on) a specific region to control the direction of the reflected light L4. For example, the uneven pattern LAc and LAv may not formed at the center (or central portion) of the lens pattern unit LA', and the uneven pattern LAc and LAv may be formed at (e.g., only at) the periphery of the lens pattern unit LA'.

The structure according to the exemplary embodiment shown in FIG. 7B may be applied to all suitable structures of one or more of the exemplary embodiments described below.

Referring again to FIGS. 5 and 6, the display element layer DPL may include the light source unit LSU included in each of the pixels PXL. For example, the display element layer DPL may include a least a pair of a first electrode ELT1 and a second electrode ELT2, and a plurality of light emitting elements LD may be disposed between the first and second electrodes ELT1 and ELT2. In some embodiments, the display element layer DPL may further include at least one conductive layer and/or insulating layer.

In an exemplary embodiment, the display element layer DPL may include the first and second electrodes ELT1 and ELT2, the first insulating layer INS1, the light emitting elements LD, a second insulating layer INS2, the first and second contact electrodes CNE1 and CNE2, and a third insulating layer INS3 that are disposed (e.g., sequentially disposed) and/or formed on the base layer BSL and/or the pixel circuit layer PCL.

Each of the first and second electrodes ELT1 and ELT2 may include at least one conductive material. For example, each of the first and second electrodes ELT1 and ELT2 may include (or be formed of) at least one metal, for example, such as silver (Ag), magnesium (Mg), aluminum (Al), platinum (Pt), palladium (Pd), gold (Au), nickel (Ni), neodymium (Nd), iridium (Ir), chromium (Cr), titanium (Ti), and/or alloys thereof, a conductive oxide, for example, such as indium tin oxide (ITO), indium zinc oxide (IZO), zinc oxide (ZnO), and/or indium tin zinc oxide (ITZO), and/or a conductive polymer, for example, such as PEDOT. However, the present invention is not limited thereto.

The first insulating layer INS1 may be disposed on the first and second electrodes ELT1 and ELT2. For example, the first insulating layer INS1 may be formed on (e.g., entirely on) the first and second electrodes ELT1 and ELT2. In addition, the first insulating layer INS1 may cover the lens pattern unit LA of the second organic layer VIA2. For example, the first insulating layer INS1 may mitigate (e.g., fill) a step caused by the lens pattern unit LA at (e.g., in or on) the second organic layer VIA2. An upper surface of the first insulating layer INS1 may be generally planar (e.g., planar or substantially planar) to provide a space (e.g., an area) where the light emitting element LD is disposed. However, the present invention is not limited thereto. For example, in another exemplary embodiment, the first insulating layer INS1 may be formed along a surface of the second organic layer VIA2. In this case, the upper surface of the first insulating layer INS1 may have a step, and may include a concave pattern that is similar to that of the second organic layer VIA2.

As described above, in some embodiments, the first insulating layer INS1 may be formed to cover (e.g., entirely cover) the first and second electrodes ELT1 and ELT2 and the second organic layer VIA2. After the light emitting elements LD are provided and aligned on the first insulating layer INS1, the first insulating layer INS1 may be partially opened to expose the first and second electrodes ELT1 and ELT2 in at least one region.

In each of emission areas where the first insulating layer INS1 is formed, a plurality of light emitting elements LD may be supplied and aligned. For example, a plurality of light emitting elements LD may be supplied to each emission area EMA using an inkjet method, and the light emitting elements LD may be aligned between the first and second electrodes ELT1 and ELT2 by an alignment voltage (e.g., a predetermined alignment voltage or alignment signal) applied to the first and second electrodes ELT1 and ELT2.

The second insulating layer INS2 may be disposed on the light emitting elements LD aligned between the first and second electrodes ELT1 and ELT2, and may expose the first and second end portions EP1 and EP2 of the light emitting elements LD. For example, the second insulating layer INS2 may be partially disposed on a portion of the light emitting elements LD, without covering the first and second end portions EP1 and EP2 of the light emitting elements LD. The second insulating layer INS2 may be formed on each emission area in an independent pattern, but the present invention is not limited thereto.

The second insulating layer INS2 is formed on the light emitting elements LD after the alignment of the light emitting elements LD is completed, so that the light emitting elements LD may be prevented or substantially prevented from deviating from the aligned positions. In some embodiments, when there is a space between the first insulating layer INS1 and the light emitting element LD before forming the second insulating layer INS2, the space may be filled during the process of forming the second insulating layer INS2. As a result, the light emitting element LD may be more stably supported.

In some embodiments, during the process of forming the second insulating layer INS2, first and second openings (e.g., 14a and 11a in FIG. 7A) for contacting the first and second contact electrodes CNE1 and CNE2 to the first and second end portions EP1 and EP2 of the light emitting element LD as described above, may be formed.

In an exemplary embodiment, the first and second contact electrodes CNE1 and CNE2 may be disposed on the second insulating layer INS2, and may be disposed on the same or substantially the same layer as each other. In this case, the first and second contact electrodes CNE1 and CNE2 may be formed using the same or substantially the same conductive material in the same or substantially the same process, but the present invention is not limited thereto.

In another exemplary embodiment, the first and second contact electrodes CNE1 and CNE2 may be disposed on different layers from each other. In this case, the first and second contact electrodes CNE1 and CNE2 may be formed using conductive materials that are the same or substantially the same as each other or that are different from each other in different processes. When the first and second contact electrodes CNE1 and CNE2 are disposed on different layers, at least one insulating layer may be further formed on any contact electrode on a lower layer of the first and second contact electrodes CNE1 and CNE2.

The first and second contact electrodes CNE1 and CNE2 may be electrically connected to the first and second end portions EP1 and EP2 of the light emitting elements LD. In addition, the first and second contact electrodes CNE1 and CNE2 may be electrically connected to the first and second electrodes ELT1 and ELT2 by passing through the first insulating layer INS1 and the second insulating layer INS2 in the at least one region. Thus, the first and second end portions EP1 and EP2 of the light emitting elements LD may be electrically connected to the first and second electrodes ELT1 and ELT2. However, in another exemplary embodiment, when the first and second contact electrodes CNE1 and CNE2 are directly connected to separate power lines and/or signal lines, the first and second contact electrodes CNE1 and CNE2 may not be directly connected to and/or electrically connected to the first and second electrodes ELT1 and ELT2.

However, the present invention is not limited thereto, and a connecting structure between the first and second contact electrodes CNE1 and CNE2 and the first and second electrodes ELT1 and ELT2 may be variously modified.

A third insulating layer INS3 may be disposed on the first and second contact electrodes CNE1 and CNE2. For example, the third insulating layer INS3 may be disposed on one surface of the base layer BSL at which (or on which) the light emitting elements LD and the first and second contact electrodes CNE1 and CNE2 are formed, and may cover the light emitting elements LD and the first and second contact electrodes CNE1 and CNE2. The third insulating layer INS3 may include at least one inorganic and/or organic layer.

In an exemplary embodiment, the third insulating layer INS3 may include a thin film encapsulation layer having a multi-layer structure, but the present invention is not limited thereto. According to one or more exemplary embodiments, at least one overcoat layer and/or encapsulation substrate may be further disposed on the third insulating layer INS3.

According to an exemplary embodiment, each of the first to third insulating layers INS1, INS2, and INS3 may include (or be formed of) a single layer or multiple layers, and may include at least one inorganic insulating material and/or an organic insulating material. For example, each of the first to third insulating layers INS1, INS2, and INS3 may include various kinds of organic or inorganic insulating materials, for example, such as silicon nitride (SiNx), but the materials included in each of the first to third insulating layers INS1, INS2, and INS3 are not limited thereto. In addition, the first to third insulating layers INS1, INS2, and INS3 may include different insulating materials, or at least some of the first to third insulating layers INS1, INS2, and INS3 may include the same or substantially the same insulating materials.

As described above, the lens pattern unit LA may be formed under (e.g., underneath) each light emitting element LD. The lens pattern unit LA may reflect the light that is emitted from the light emitting element LD towards the lens pattern unit LA upward to improve the emission efficiency of the display device, and may adjust a direction of the reflected light to improve the viewing angle characteristics of the display device. The structure and shape of the lens pattern unit LA is not limited to the one or more exemplary embodiments described herein, and may be variously modified.

Hereinafter, one or more other exemplary embodiments of the display device will be described with reference to FIGS. 8-11. In the following exemplary embodiments, the same or substantially the same constituent elements as those of the previously described exemplary embodiments will be referred to with the same or substantially the same reference symbols, and thus, redundant description thereof may be omitted or simplified, and the differences therebetween will be mainly described in more detail.

Figure 8:
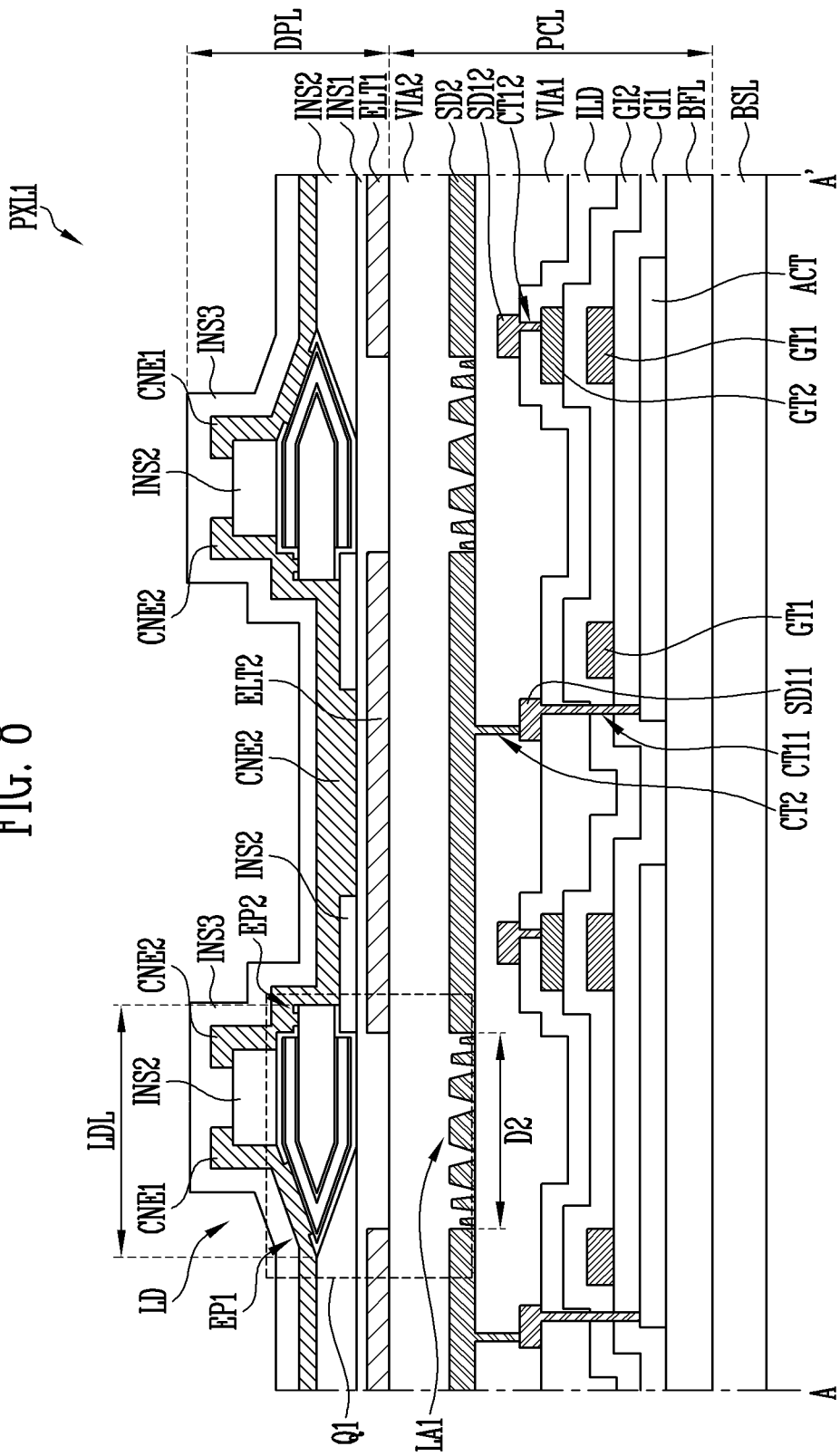
FIG. 8 is a cross-sectional view of a pixel according to another exemplary embodiment.
Figure 9:
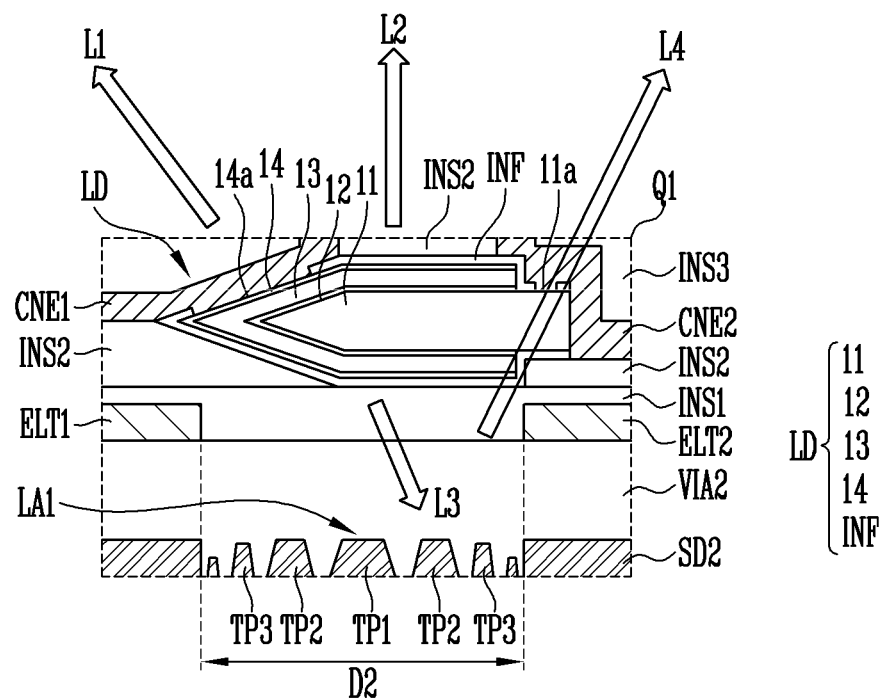
FIG. 9 is a partial enlarged view of the area Q1 of FIG. 8.

FIG. 8 is a cross-sectional view of a pixel according to another exemplary embodiment. FIG. 9 is a partial enlarged view of the area Q1 of FIG. 8. The exemplary embodiment of FIGS. 8 and 9 is different from one or more of the exemplary embodiments described above. For example, in the exemplary embodiment of FIGS. 8 and 9, the lens pattern unit LA1 is formed in the second metal layer SD2 instead of the second organic layer VIA2, and the other structures may be the same as or substantially the same as the one or more exemplary embodiments described above.

Referring to FIGS. 8 and 9, the second metal layer SD2 may include a lens pattern unit LA1. The lens pattern unit LA1 may be disposed under (e.g., underneath) the light emitting element LD to include at least a portion that overlaps with the light emitting element LD. The lens pattern unit LA1 may be formed to correspond one-to-one with each light emitting element LD, but the present invention is not limited thereto. For example, in other embodiments, a plurality of light emitting elements LD may correspond to one lens pattern unit LA1.

A shape of the lens pattern unit LA1 in a plan view may be the same as or similar to (e.g., substantially the same as) the lens pattern unit LA shown in FIG. 5. For example, the lens pattern unit LA1 may have a circular or elliptical shape in a plan view.

In an exemplary embodiment, a width D2 of the lens pattern unit LA1 may be less than a length LDL of the light emitting element LD, but in another exemplary embodiment, the width D2 of the lens pattern unit LA1 may be greater than the length LDL of the light emitting element LD.

The lens pattern unit LA1 may be disposed under (e.g., underneath) the light emitting element LD to reflect light that is emitted downward from the light emitting element LD upward. That is, the lens pattern unit LA1 may improve an emission efficiency of a display device including a pixel PXL1.

The lens pattern unit LA1 may be formed concurrently (e.g., simultaneously) when forming the second metal layer SD2. For example, the lens pattern unit LA1 may be formed by disposing (e.g., entirely disposing) the second metal layer SD2 on the first organic layer VIA1, and patterning the second metal layer SD2.

The lens pattern unit LA1 may include a plurality of taper portions TP1, TP2, and TP3. The plurality of taper portions TP1, TP2, and TP3 may include a first taper portion TP1, a second taper portion TP2, and a third taper portion TP3. The second taper portion TP2 may be adjacent to (e.g., surround) the first taper portion TP1, and the third taper portion TP3 may be adjacent to (e.g., surround) the second taper portion TP2.

Each of taper portions TP1, TP2, and TP3 may be disposed to be spaced from each other, but the present invention is not limited thereto, and in other embodiments at least a portion of the taper portions TP1, TP2, and TP3 may contact each other.

Each of the taper portions TP1, TP2, and TP3 may have different taper angles. A taper angle is defined as an acute angle between an axis line and a side surface. For example, a taper angle of the first taper portion TP1 may be the largest, a taper angle of the second taper portion TP2 may be smaller, and a taper angle of the third taper portion TP3 may be the smallest. However, the present invention is not limited thereto, and taper angles of the taper portions TP1, TP2, and TP3 may be variously modified as needed or desired.

At least some of light L3 that is emitted downward from the light emitting element LD may transmit through the second organic layer VIA2 toward the second metal layer SD2. According to an exemplary embodiment, the second metal layer SD2 may include a highly reflective metal material. The light L3 that is transmitted toward the second metal layer SD2 may be reflected at a surface of each of the taper portions TP1, TP2, and TP3.

As described above, each of the taper portions TP1, TP2, and TP3 may have different taper angles, so that light incident on the lens pattern unit LA1 of the second metal layer SD2 may be reflected in different directions. The reflected light L4 reflected by one or more of the taper portions TP1, TP2, and TP3 may be emitted to the outside. The emission efficiency and viewing angle characteristics of the display device may be improved by the light emitted to the outside.

The structure according to the exemplary embodiment described with reference to FIGS. 8 and 9 may be applied to the one or more exemplary embodiments described above, and to one or more exemplary embodiments described below. For example, referring to the one or more exemplary embodiments of FIGS. 5 to 7B, the second organic layer VIA2 may include the lens pattern unit LA, and the second metal layer SD2 may include the lens pattern unit LA1.

Figure 10:
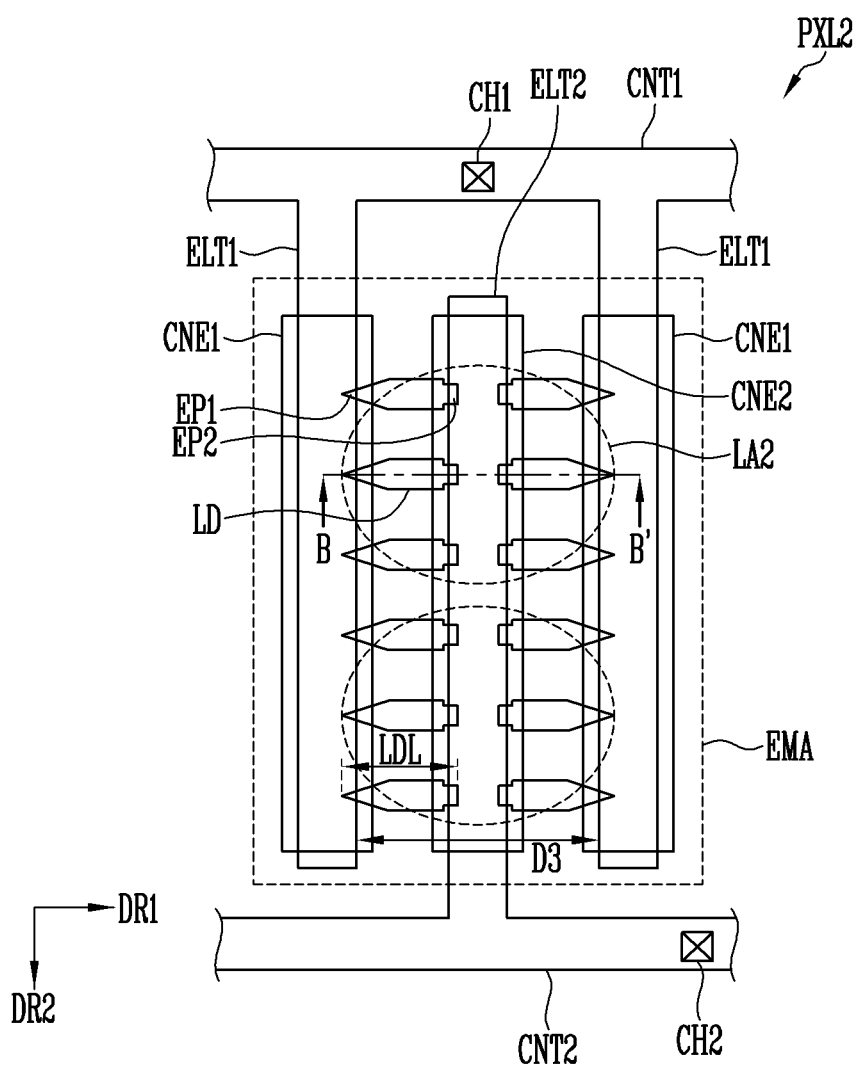
FIG. 10 is a top plan view of a pixel according to another exemplary embodiment.
Figure 11:
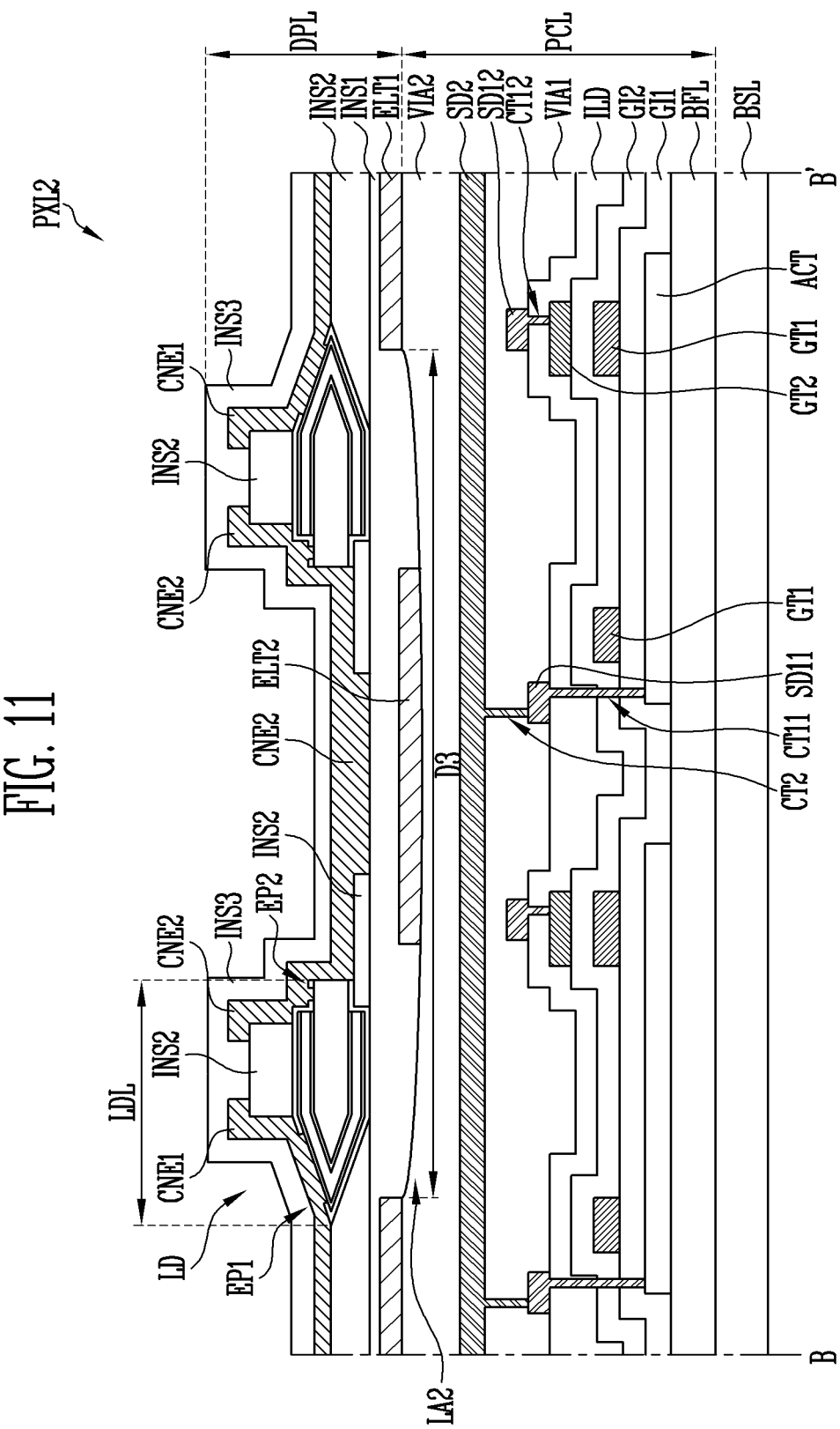
FIG. 11 is a cross-sectional view taken along the line B-B' of FIG. 10.

FIG. 10 is a top plan view of a pixel according to another exemplary embodiment. FIG. 11 is a cross-sectional view taken along the line B-B' of FIG. 10. The exemplary embodiment of FIGS. 10 and 11 is different from the one or more exemplary embodiments described above. For example, in the exemplary embodiment of FIGS. 10 and 11, the lens pattern unit LA2 is formed to have a greater width (e.g., than the lens pattern units LA and LA1), and does not correspond one-to-one with the light emitting elements LD, and the other structures thereof may be the same as or similar to (e.g., substantially the same as) the one or more exemplary embodiments described above.

Referring to FIGS. 10 and 11, the second organic layer VIA2 may include the lens pattern unit LA2. The lens pattern unit LA2 may have a circular or elliptical shape in a plan view, but the present invention is not limited thereto.

The lens pattern unit LA2 may be disposed under (e.g., underneath) the light emitting element LD, and may overlap with a plurality of light emitting elements LD. The exemplary embodiment of FIG. 10 illustrates that the lens pattern unit LA2 may overlap with six light emitting elements LD, but the present invention is not limited thereto, and the lens pattern unit LA2 may overlap with fewer than or more than six light emitting elements LD in other embodiments.

A width D3 of the lens pattern unit LA2 may be greater than a length LDL of the light emitting element LD. For example, the width D3 of the lens pattern unit LA2 may be greater than or equal to twice the length LDL of the light emitting element LD.

The lens pattern unit LA2 may reflect the light that is emitted downward from the light emitting element LD upward. More light may be reflected (or emitted) upward by the lens pattern unit LA2, and the emission efficiency and viewing angle characteristics of the display device may be improved.

Because the other configurations (e.g., layers and components) shown in FIGS. 10 and 11 are the same as or similar to (e.g., substantially the same as) the lens pattern unit LA described with reference to the one or more exemplary embodiments of FIGS. 5 to 7B, redundant descriptions thereof may be omitted.

While one or more exemplary embodiments of the present invention are described with reference to the attached drawings, it should be understood that embodiments described herein should be considered in a descriptive sense only and not for purposes of limitation. Accordingly, those with ordinary skill in the art of which the present invention pertains will understand that various aspect and features of the present invention may be modified without departing from the spirit and scope of the present invention as defined in the following claims, and their equivalents.

What is claimed is:

1. A display device comprising:
   a base layer;
   a pixel circuit layer on the base layer; and
   a display element layer on the pixel circuit layer,
   wherein the pixel circuit layer comprises a lens pattern at a recess between the display element layer and the base layer,
   wherein the display element layer comprises a first electrode, a second electrode spaced from the first electrode, an insulating layer on the first electrode and the second electrode, and a light emitting element on the insulating layer, the light emitting element being between the first electrode and the second electrode, and the insulating layer being between the light emitting element and the first electrode and the second electrode,
   wherein at least a portion of an active layer of the light emitting element overlaps the lens pattern in a thickness direction of the base layer,
   wherein at least a portion of the light emitting element overlaps with the lens pattern,
   wherein the pixel circuit layer further comprises at least one circuit element electrically connected to the light emitting element of the display element layer,
   wherein a portion of the insulating layer that is between the first electrode and the second electrode and between the light emitting element and the first electrode and the second electrode is disposed in the lens pattern at the recess, wherein the first electrode and the second electrode are in a same layer and spaced from each other in a first direction that is perpendicular to the thickness direction of the base layer, wherein the light emitting element comprises a first semiconductor layer, the active layer, and a second semiconductor layer arranged along the first direction, wherein an area of the first semiconductor layer where light is emitted overlaps the lens pattern in a plan view, and wherein the first electrode and the second electrode do not overlap with the active layer in the plan view.

2. The display device of claim 1, wherein
the active layer is around at least a portion of the first semiconductor layer, wherein the second semiconductor layer is a different type from that of the first semiconductor layer and surrounding the at least the portion of the active layer.

3. The display device of claim 2, wherein
the light emitting element comprises a first end portion and a second end portion, the first end portion comprising the active layer, and the second end portion not comprising the active layer.

4. The display device of claim 3, wherein
the display element layer comprises a first contact electrode on the first electrode and electrically connected to the first end portion, and a second contact electrode on the second electrode and electrically connected to the second end portion.

5. The display device of claim 1, wherein
the pixel circuit layer comprises a plurality of transistors and an organic layer covering the plurality of transistors, the organic layer comprising the lens pattern.

6. The display device of claim 5, wherein
the insulating layer covers the first electrode, the second electrode, and the organic layer, and wherein a refractive index of the insulating layer is greater than a refractive index of the organic layer.

7. The display device of claim 5, wherein
the lens pattern comprises an uneven pattern, and wherein the uneven pattern is configured to reflect an incident light irregularly.

8. The display device of claim 1, wherein
the first electrode and the second electrode do not overlap with the lens pattern.

9. The display device of claim 8, wherein
a width of the lens pattern is less than a length of the light emitting element.

10. The display device of claim 9, wherein
the lens pattern corresponds one-to-one with the light emitting element.

11. The display device of claim 1, wherein
a width of the lens pattern is greater than or equal to twice a length of the light emitting element.

12. The display device of claim 1, wherein the lens pattern is located between the first electrode and the second electrode along the first direction.

* * * * *